(12) United States Patent
Naik et al.

(10) Patent No.: US 12,550,422 B2
(45) Date of Patent: Feb. 10, 2026

(54) SEMICONDUCTOR DEVICE AND METHOD OF FABRICATING A SEMICONDUCTOR DEVICE

(71) Applicant: Infineon Technologies Austria AG, Villach (AT)

(72) Inventors: Harsh Naik, El Segundo, CA (US); Timothy Henson, Mount Shasta, CA (US); Ashita Mirchandani, Rolling Hills Estates, CA (US); Robert Haase, San Pedro, CA (US); Honghai He, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 400 days.

(21) Appl. No.: 18/121,293

(22) Filed: Mar. 14, 2023

(65) Prior Publication Data
US 2023/0307450 A1 Sep. 28, 2023

(30) Foreign Application Priority Data

Mar. 24, 2022 (EP) .................................... 22164157

(51) Int. Cl.
| | | |
|---|---|---|
| H01L 27/088 | (2006.01) | |
| H01L 21/265 | (2006.01) | |
| H01L 21/266 | (2006.01) | |
| H03K 17/687 | (2006.01) | |
| H10D 30/01 | (2025.01) | |
| H10D 30/65 | (2025.01) | |
| H10D 30/66 | (2025.01) | |
| H10D 62/17 | (2025.01) | |

(Continued)

(52) U.S. Cl.
CPC ....... *H10D 84/83* (2025.01); *H01L 21/26513* (2013.01); *H01L 21/266* (2013.01); *H03K 17/6871* (2013.01); *H10D 30/0289* (2025.01); *H10D 30/0297* (2025.01); *H10D 30/658* (2025.01); *H10D 30/668* (2025.01); *H10D 62/393* (2025.01); *H10D 64/01* (2025.01); *H10D 64/117* (2025.01); *H10D 84/0135* (2025.01); *H10D 84/0151* (2025.01); *H10D 84/038* (2025.01)

(58) Field of Classification Search
None
See application file for complete search history.

(56) References Cited

U.S. PATENT DOCUMENTS

| | | |
|---|---|---|
| 5,780,340 A | 7/1998 | Gardner et al. |
| 8,236,648 B2 | 8/2012 | Hashitani |

(Continued)

FOREIGN PATENT DOCUMENTS

WO 0172092 A1 9/2001

*Primary Examiner* — William C Trapanese
(74) *Attorney, Agent, or Firm* — Murphy, Bilak & Homiller, PLLC

(57) ABSTRACT

In an embodiment, a semiconductor device is provided that includes: a vertical power FET configured to switch a load current and provide a channel of a first conductivity type; and a lateral FET configured to drive the vertical power FET and provide a channel of a second conductivity type opposing the first conductivity type. The vertical power FET and the lateral FET are monolithically integrated into a semiconductor substrate of the first conductivity type and a drain of the lateral FET is electrically coupled to a gate of the vertical power FET.

15 Claims, 13 Drawing Sheets

(51) Int. Cl.
*H10D 64/00* (2025.01)
*H10D 64/01* (2025.01)
*H10D 84/01* (2025.01)
*H10D 84/03* (2025.01)
*H10D 84/83* (2025.01)

(56) References Cited

U.S. PATENT DOCUMENTS

| | | |
|---|---|---|
| 2003/0047792 A1 | 3/2003 | Disney et al. |
| 2006/0220140 A1 | 10/2006 | Robb et al. |
| 2011/0241170 A1* | 10/2011 | Haeberlen ............ H10D 84/038 |
| | | 257/532 |
| 2012/0025874 A1 | 2/2012 | Saikaku et al. |
| 2012/0175634 A1 | 7/2012 | Weis |
| 2013/0334601 A1 | 12/2013 | Dong et al. |
| 2014/0073102 A1 | 3/2014 | Toyoda et al. |
| 2014/0091384 A1 | 4/2014 | Petruzzi et al. |
| 2014/0374773 A1 | 12/2014 | Ryu et al. |
| 2015/0380403 A1 | 12/2015 | Kotsar et al. |
| 2015/0380543 A1* | 12/2015 | Zink .................... H10D 62/127 |
| | | 257/334 |
| 2016/0268423 A1 | 9/2016 | Koepp et al. |
| 2018/0350980 A1 | 12/2018 | Castro et al. |
| 2021/0305063 A1 | 9/2021 | Or-Bach et al. |
| 2023/0307450 A1 | 9/2023 | Naik et al. |

* cited by examiner

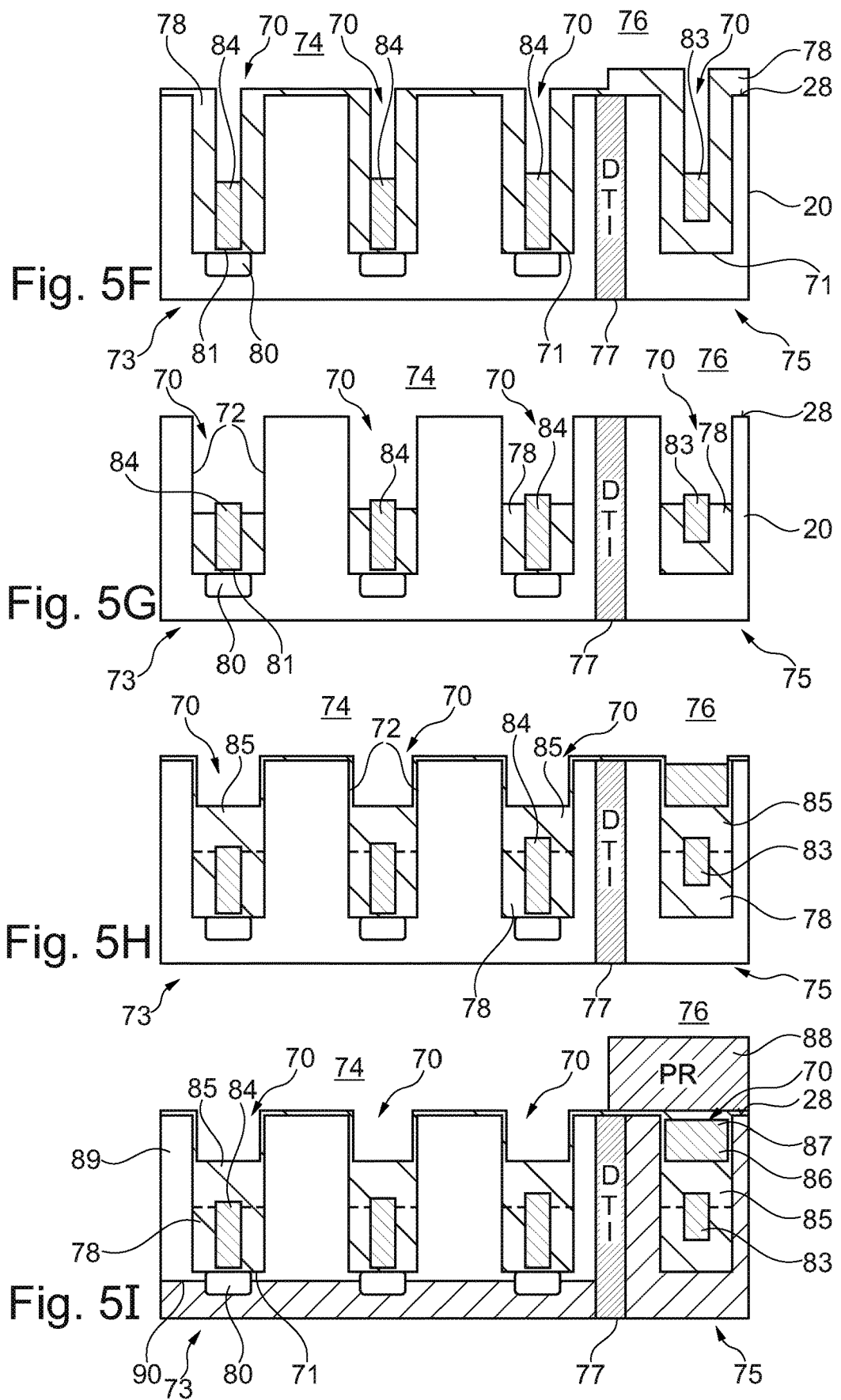

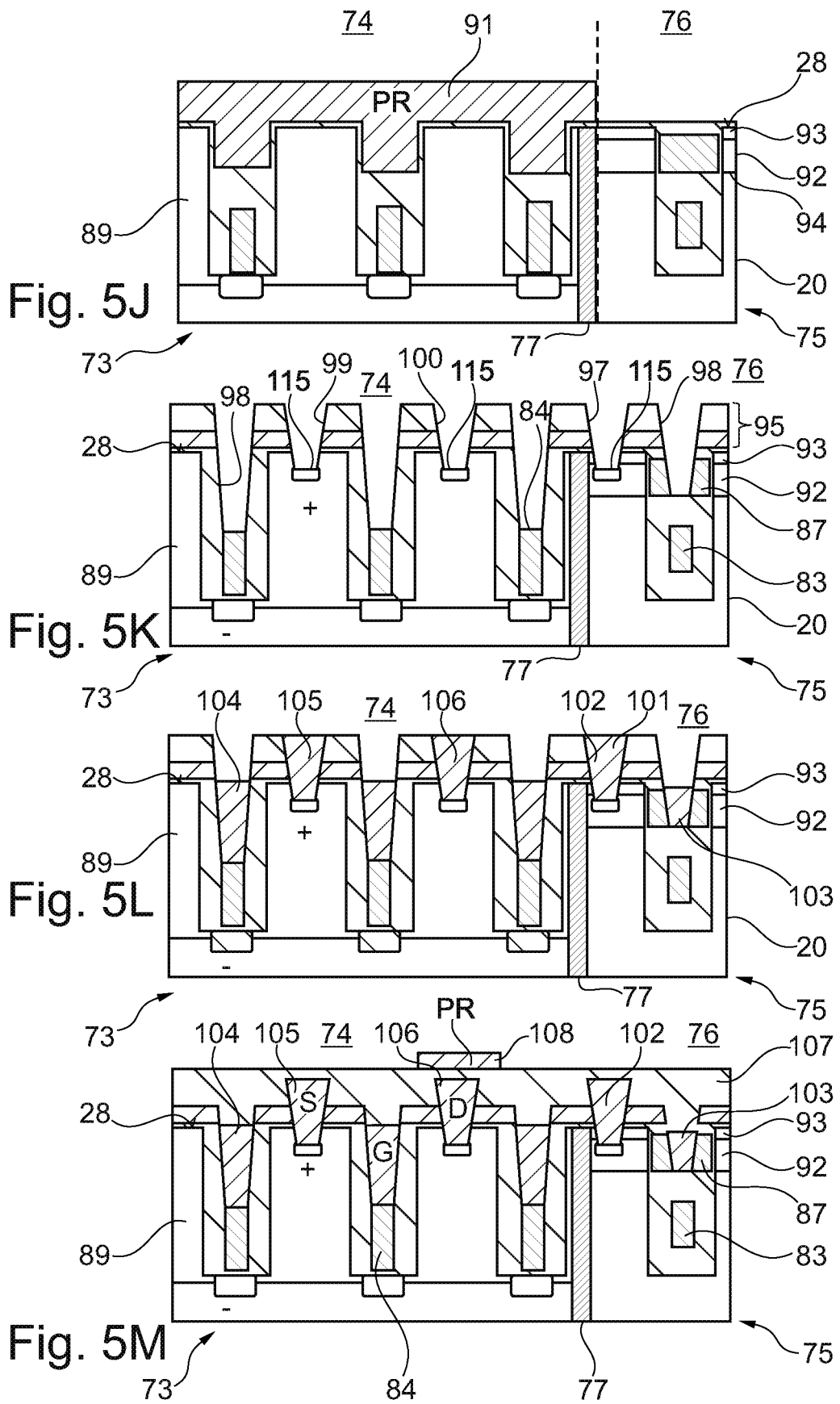

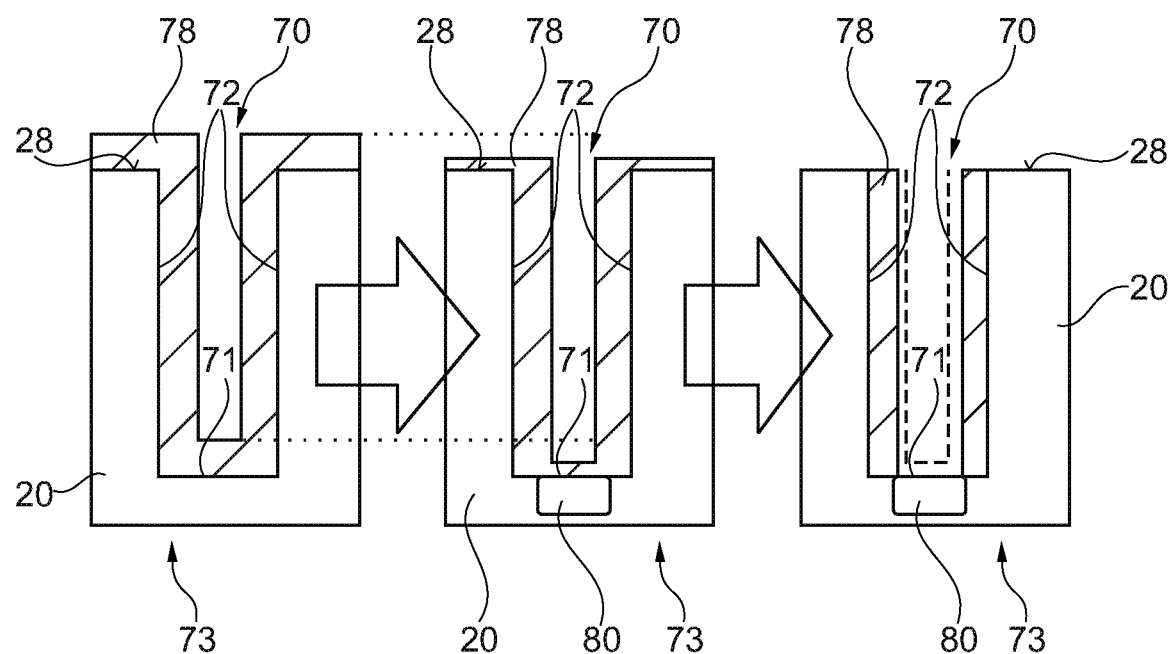

SEMICONDUCTOR DEVICE AND METHOD OF FABRICATING A SEMICONDUCTOR DEVICE

BACKGROUND

Common transistor devices for power electronic applications include Si CoolMOS®, Si Power MOSFETs, and Si Insulated Gate Bipolar Transistors (IGBTs). Power transistors devices may be used in circuits for power control. For example, two power transistor device may be coupled to form a half bridge circuit may be driven by gate control circuitry to switch a load current.

WO 01/72092 A1 discloses a multichip module in which various components of a circuit are included within a single package. The circuit includes a first power MOSFET providing the high side switch of a half bridge circuit, a second power MOSFET providing the low side switch of the half bridge circuit and a gate driver for controlling switching of the high side switch and low side switch. The first power MOSFET, second power MOSFET and the gate drive are each provided as separate packaged components that are mounted within the module. It is, however, desirable to reduce the size of circuits for power control.

SUMMARY

According to the present disclosure, a semiconductor device is provided that comprises a vertical power FET (Field Effect Transistor) and a lateral FET. The vertical power FET is configured to provide a channel of a first conductivity type and the lateral FET is configured to provide a channel of a second conductivity type that opposes the first conductivity type. The vertical power FET and the lateral FET are monolithically integrated into a semiconductor substrate of the first conductivity type. A drain of the lateral FET is electrically coupled to the gate of the vertical power FET.

According to the present disclosure, a semiconductor device is provided that comprises a vertical power FET (Field Effect Transistor) that is configured to switch a load current and a lateral FET that is configured to drive the vertical power FET. The vertical power FET comprises a channel region of a first conductivity type and the lateral FET comprises a channel region of a second conductivity type, that opposes the first conductivity type. The vertical power FET and the lateral FET are monolithically integrated into a semiconductor substrate of the first conductivity type. A drain of the lateral FET is electrically coupled to the gate of the vertical power FET.

The first conductivity type may be n-type and the second conductivity type p-type, or vice versa.

The vertical power FET has a vertical drift path that extends substantially perpendicularly to the first surface of the semiconductor substrate. In contrast, the lateral FET has a drift path that extends substantially parallel to the first surface of the semiconductor substrate.

The vertical power FET may be a vertical MOSFET or MISFET with a charge compensation structure. The lateral FET may be a lateral MOSFET or MISFET.

The lateral FET forms a portion of the gate driver circuitry for driving the vertical power FET, since the drain of the lateral FET is electrically coupled to the gate of the vertical power FET. The lateral FET is monolithically integrated with the power vertical power FET which it is to control in the semiconductor substrate. This arrangement enables the physical size of the circuit to be reduced and the length of the electrical connections between the lateral FET and the vertical power FET to be reduced, thus reducing losses and improve efficiency.

In some embodiments, the semiconductor substrate comprises a well of the second conductivity type which extends into the semiconductor substrate from the first surface. The lateral FET is formed in the well of the second conductivity type.

In some embodiments, the lateral FET comprises a plurality of trenches, each having a base and sidewalls. The trenches extend into the semiconductor substrate from the first surface. The trenches may each have an elongate strip-like form and extend substantially parallel to one another. A gate insulating layer is arranged at the base of the trench and a gate electrode is arranged on the gate insulating layer.

In some embodiments, the lateral FET comprises a source region and drain region which are arranged at the first surface of the semiconductor substrate. The base of the trench is arranged in the semiconductor substrate. Therefore, the gate electrode which is arranged on the gate insulating layer at the base of the trench, is arranged in within the semiconductor substrate and in a different plane to the source region and drain region.

In some embodiments, the lateral FET further comprises a doped region which is doped with the first conductivity type. The doped region is arranged at the base of the trench and forms the base of the trench. The doped region may have a higher doping level than the doping level of the semiconductor substrate. This doped region forms the body region of the lateral FET.

In some embodiments, the lateral FET further comprises an electrically conductive dummy field plate that is arranged in the trench above and electrically insulated from the gate electrode. This dummy field plate is formed of conducive material and may be electrically floating. In other embodiments, the upper portion of the trenches of the lateral FET that is above the gate electrode is filled with electrically insulating material.

In some embodiments, the vertical power FET comprises a plurality of trenches, each having a base and side walls, which extend into the semiconductor substrate from the first surface. Each trench of the vertical power FET comprises a field plate arranged at the bottom of the trench and a gate electrode arranged above and electrically insulated from the field plate. The trenches of the vertical power FET may each have an elongate stripe-like structure extending parallel to one another and in some embodiments also parallel to the trenches of the lateral FET.

In the lateral FET, the gate electrode is arranged at the base of the trench. The lateral FET has the opposing arrangement compared to the vertical power FET which has the field plate positioned towards the base of the trench and the gate electrode arranged towards the top of the trench.

In some embodiments, the plurality of trenches of the vertical power FET are each lined with a first electrically insulating layer that has a thickness on the base of the trench that is greater than a thickness of the gate insulating layer arranged on the base of the trench of the lateral FET. This assists in providing electrical insulation between the field plate of the vertical power FET, which is arranged at the base of the trench of the vertical power FET, and the semiconductor substrate.

In some embodiments, the plurality of trenches of the lateral FET and the plurality of trenches of the vertical power FET have substantially the same depth, that is the base of the trenches is arranged at substantially the same distance from the first surface. In some embodiments, the plurality of trenches of the lateral FET and the plurality of trenches of the vertical power FET have substantially the same width. This arrangement enables the trenches to be formed using the same processing steps, for example etching steps.

In some embodiments, the semiconductor substrate of the first conductivity type provides the vertical drift region of the vertical power FET and. In some embodiments, the semiconductor substrate of the first conductivity type provides the body region of the lateral FET.

The semiconductor substrate may be formed of monocrystalline silicon or an epitaxially deposited silicon layer epitaxially grown on a silicon substrate, often referred to as an epi layer.

In some embodiments, the vertical power FET further comprises a body region of the second conductivity type arranged on the drift region, a source region of the first conductivity that is arranged at the first surface and on or in the body region and a drain region arranged at a second surface of the semiconductor substrate, that opposes the first surface.

In some embodiments, the well of the second conductivity type forms a pn junction with the semiconductor substrate, since the semiconductor substrate comprises the first conductivity type. In some embodiments, this pn junction between the well and the semiconductor substrate is arranged at a greater depth from the first major surface than the pn junction formed between the body region and the drift region of the vertical power FET.

In some embodiments, the semiconductor device further comprises a further FET that is configured to drive the vertical power FET. The further FET is configured to provide a channel of the first conductivity type. This is in contrast to the lateral FET which comprises a channel region of the second conductivity type. The further FET is monolithically integrated into the semiconductor substrate and has a drain electrically coupled to the gate of the vertical power FET. Consequently, the drain of the further FET is electrically coupled to the drain of the lateral FET. The lateral FET and the further FET provide an output stage of the gate driver circuit for driving the gate of the vertical power FET.

According to the present disclosure, a method for fabricating a semiconductor device having a vertical power FET for switching a load current and a lateral FET for driving the vertical power FET is also provided. The method comprises forming a plurality of trenches in a first surface of the semiconductor substrate that has a first conductivity type. Each trench has a base and sidewalls. A first electrically insulating layer is formed which lines the base and the sidewalls of the trenches and leaves a gap towards the centre of the trench which is unoccupied by the first electrically insulating layer. The first insulating layer is removed from the base of a first subset of trenches of the plurality of trenches. The first subset of trenches are located in a predefined area of the semiconductor substrate that is for forming the lateral FET for driving the vertical power FET. The lateral FET has a channel of a second conductivity type, that opposes the first conductivity type. A gate insulating layer is formed on the base of this first subset of trenches. Conductive material is inserted into the plurality of trenches so as to form a gate electrode in the first subset of trenches and a field electrode in a second subset of the plurality of trenches. The second subset of trenches are for forming a vertical power FET that comprises a channel of the first conductivity type. The second subset of trenches are arranged outside of the predefined area and are located in a switching area of the semiconductor substrate.

The semiconductor substrate has a switching area in which the vertical power FET configured to have a channel of the first conductivity type will be formed. The semiconductor substrate also has a predefined area, which is outside of the switching area and in which a lateral FET that is configured to have a channel of the second conductivity type will be formed. The predefined area may be arranged laterally adjacent the switching area and may be electrically isolated from the switching area. The semiconductor substrate includes a plurality of trenches, whereby a first subset of the plurality of trenches are arranged in the predefined area and second subset of the plurality of trenches are arranged in the switching area. The trenches of the first subset and of the second subset may have substantially the same dimensions.

The gate electrode of the lateral FET is formed in the lower portion of the first subset of trenches arranged in the predefined area and the field plate of the vertical FET is formed in the lower portion of the second subset of trenches arranged in the switching area. The base and sidewalls of the second subset of trenches may be lined with the first electrically insulating layer so as to electrically insulate the conductive material inserted into the trenches from the semiconductor substrate. The sidewalls of the first subset of trenches may be lined with the first electrically insulating material, whereas the base of the trench of the first subset trenches is lined with the gate insulating layer, which is typically thinner than the thickness of the first electrically insulating layer on the sidewalls of the first subset of trenches.

In some embodiments, the conductive material is inserted into the plurality of trenches such that it fills the trenches. A portion of the conductive material is then removed from an upper portion of the plurality of trenches so as to form the gate electrode in the lower portion of the first subset of trenches and the field electrode in the lower portion of the second subset of the plurality of trenches.

In some embodiments, the method further comprises forming a second insulating layer in the plurality of trenches that lines the sidewalls in the upper portion of the plurality of trenches and covers the gate electrodes in the first subset of trenches and that covers the field plates in the second subset of trenches. The second insulating layer forms a gate insulating layer in the second subset of trenches. Conductive material is formed in at least the second subset of trenches for the vertical power FET and a gate electrode is formed in the second subset of trenches which is arranged above and is electrically insulated from the field plate formed in the lower portion of the second substrate such trenches.

In some embodiments, the method further comprises implanting dopants of the second conductivity type into the semiconductor substrate in the predefined area, and, in some embodiments, not in the switching area, and forming a well having the second conductivity type. The well having the second conductivity type extends from the first surface of the semiconductor substrate into the semiconductor substrate and has a base which is positioned within the semiconductor substrate and spaced apart from the second surface of the semiconductor substrate which opposes the first surface.

In some embodiments, dopants of the second conductivity type are implanted into the switching area to form a body region of the vertical power FET and dopants of the first conductivity type are implanted into the switching area to form a source region on or in the body region. The first and second dopants for forming the source region and the body region, respectively, may be exclusively implanted into the switching area. In some embodiments, the dopants of the second conductivity type are implanted into the predefined area for the lateral FET in addition to the switching area for the power FET and the dopants of the first conductivity type of the source region are implanted solely into the switching area.

In some embodiments the method further comprises forming a metallization structure on the first surface. In some embodiments, a third electrically insulating layer which forms part of the metallization structure is formed on the first surface of the semiconductor substrate. In the switching area, a first opening is formed in the third insulating layer for a contact to each of the gate electrodes positioned in the second subset of trenches and a second opening is formed in the third insulating layer for a contact to each of the source regions. In the predefined area, a third opening is formed in the third insulating layer for a contact to the gate electrode positioned on the lower portion of the first subset of trenches and also a fourth opening is formed in the third insulating layer for forming a contact to the well in the semiconductor substrate. In some embodiments, a fifth opening is formed in the third insulating layer for forming a further contact to the well in the semiconductor substrate. The fourth and fifth openings may be positioned on opposing sides of individual ones of the first subset of trenches in order to form a source and drain contact for the lateral FET. Conductive material is then inserted into the openings to form the contacts.

In some embodiments, removing the first insulating layer from the base of the first subset of trenches and forming a gate insulating layer on the base of the first subset of trenches may be performed using the following method. The second subset of trenches in the switching area is covered with a first mask, whereby the first subset of trenches and the predefined area for the lateral FET remains uncovered by the first mask. The first insulating layer positioned at the base of the first subset of trenches is dry etched and the thickness of the first insulating layer at the base of the first subset of trenches is reduced. The first insulating layer is then wet etched such that the first insulating layer is removed entirely from a portion of the base of the first subset of trenches and such that the thickness of the first insulating layer on the sidewalls of the first subset of trenches is reduced but such that the sidewalls are still covered by the remainder of the first electrically insulating layer. The gate insulating layer is then formed at the base of the first subset of trenches and the first mask is then removed.

The gate insulating layer may be formed at the base of the first subset of trenches by oxidation of the exposed region of the semiconductor substrate, for example.

In some embodiments, the method further comprises after removing the first insulating layer from the base of the first subset of trenches and before forming the gate insulating layer on the base of the first subset of trenches, implanting dopants of the first conductivity type into the semiconductor substrate under the base of the first subset of trenches. Afterwards, the gate insulating layer is formed on the base of the first subset of trenches. This method may be used to form a region of the first conductivity type which immediately adjoins the base of the first subset of trenches. This doped region provides the body region of the lateral FET.

In some embodiments, the method further comprises covering the switching area with a second mask, whereby the predefined area remains uncovered by the second mask, and then implanting the dopants of the second conductivity type into the semiconductor substrate in the predefined area to form well. The second mask is then removed and the predefined area is covered with a third mask, whereby the switching area remains uncovered by the third mask. Whilst the predefined area is covered with the third mask, dopants of the second conductivity type are implanted into the switching area to form the body region and dopants of the first conductivity type are implanted into the switching area to form the source region on or in the body region.

In some embodiments, the method further comprises forming a metallisation structure on the first surface of the semiconductor substrate and electrically coupling the drain of the lateral FET to a gate of the vertical power FET. For example, the drain of the lateral FET may be electrically coupled to the gate of the vertical power FET using a conductive trace formed in the metallization structure on the first surface.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 7A to 7C illustrate a method for forming the gate insulating layer at the base of the trenches of the lateral FET.

DETAILED DESCRIPTION

Figure 1:
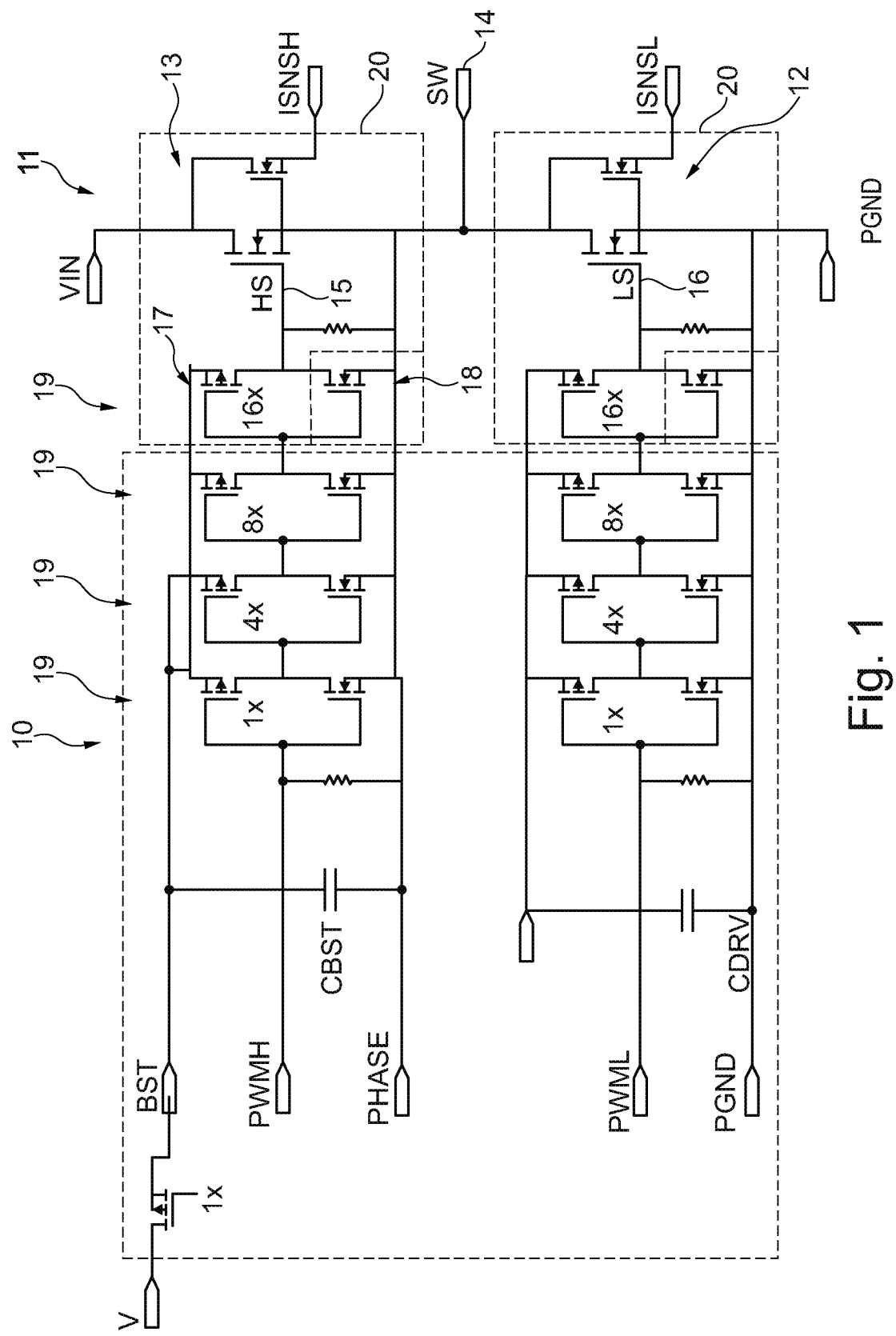
FIG. 1 illustrates a diagram of a circuit including a half-bridge circuit and a gate driver circuit for switching the half-bridge circuit.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

According to the present disclosure, a semiconductor device is provided that includes a vertical power FET and a lateral FET monolithically integrated into a semiconductor substrate. The lateral FET is electrically coupled to the vertical power FET so that the lateral FET can form part of a gate driver circuit for driving the vertical power FET. The lateral FET may provide part of the output stage of the gate driver circuit.

The semiconductor device may be used in DCDC applications, where integrating driver devices in power MOSFET can result in better performance and higher frequency. Bringing drivers into the die of the power switch can add on efficiency gains from power MOSFET Figure-of-Merit (FOM) improvement.

This disclosure builds driver/control devices with lateral channels and power devices with vertical channels into a single chip and can deliver a higher current than CMOS/LDMOS integrated solutions. Using the deep trench isolation available in the vertical power FET processes, a PMOS device integration is enabled with minimal change/addition to the process flow of the vertical power MOSFET by making a p-channel at the bottom of some of the power FET trenches. By integrating the deep channel PMOS device into the power FET process flows, die front side interconnects are enabled and die area is saved. This semiconductor device can be used to optimize high frequency performance and can be used in multiphase modules and chiplet integration and performance gain potential for higher frequency DCDC applications.

FIG. 1 illustrates a diagram of a circuit that includes a gate driver circuit 10 for driving a half-bridge circuit 11. The half-bridge circuit 11 comprises a low side switch 12 and a high side switch 13 which are coupled at an output node 14 for switching a load current. The low side switch 12 and the high side switch 13 are each provided by a transistor device which has a gate 15, 16, which is driven by gate driver circuit 10. The gate driver circuit 10 comprises a plurality of pairs of transistor devices 17, 18, each of which may be a lateral FET, each pair forming a stage 19. In order to provide such a circuit, the gate driver circuit 10 may be provided in the form of a first packaged component and each of the low side switch 12 and the high side switch 13 may be provided in a separate package.

However, according to the present disclosure, the vertical power FET, which may provide the low side switch 12 or the high side switch 13 of the half bridge circuit 11, is monolithically integrated into a semiconductor substrate with one or both of the lateral FETs 17, 18 of the output stage 19 of the gate driver circuit 10 which are electrically connected to the gate of the vertical power MOSFET which they are to drive. This is indicated in FIG. 1 by the dashed line 20 which encloses the devices which are included in a single semiconductor substrate, i.e. semiconductor chip or die.

Figure 2:
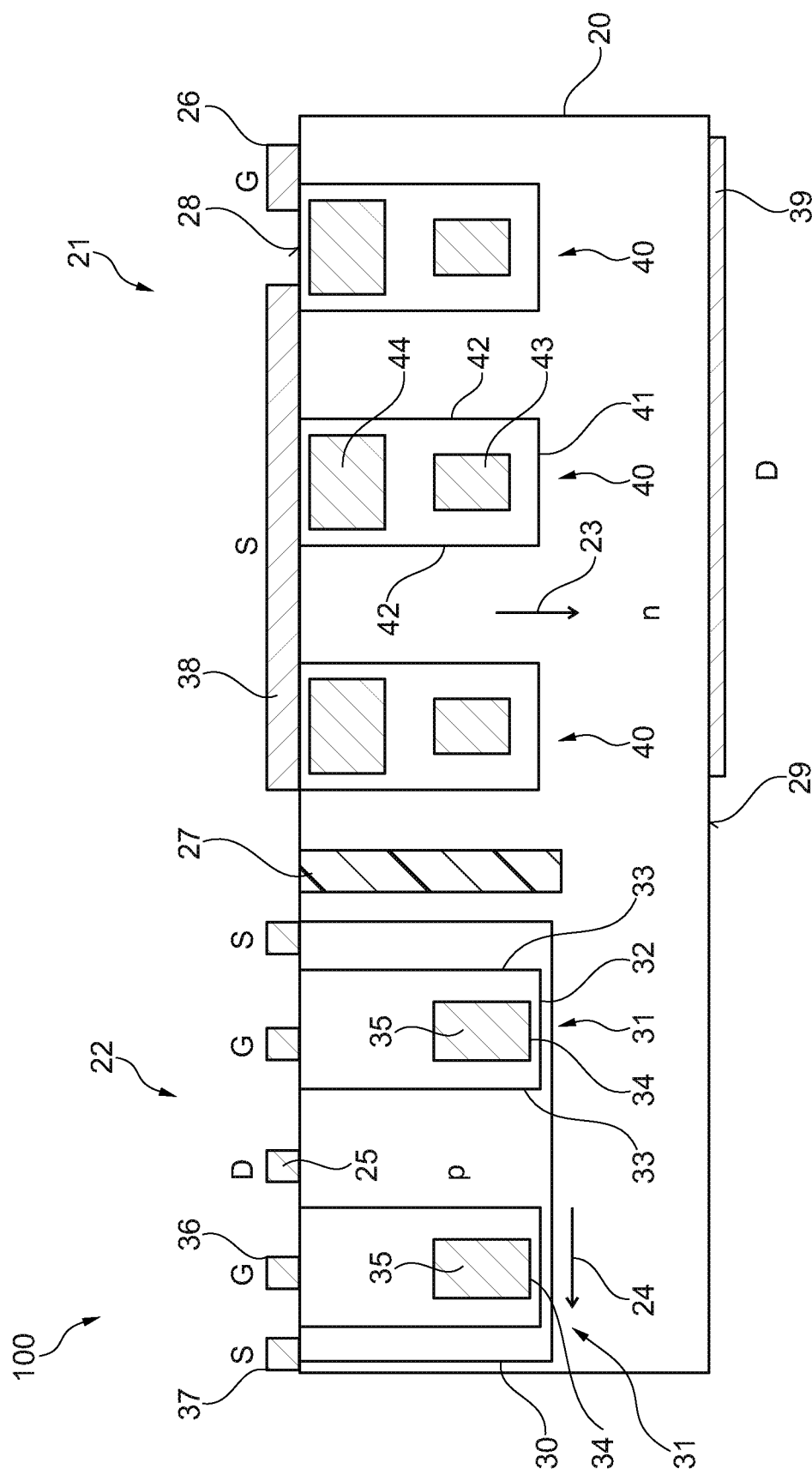
FIG. 2 illustrates a schematic diagram of a semiconductor device including a vertical power FET and a lateral FET that are monolithically integrated in a common semiconductor substrate.

FIG. 2 illustrates a schematic diagram of a semiconductor device 1000 including a vertical power FET 21 and a lateral FET 22. The vertical power FET 21 is configured for switching a load current and has a channel region, indicated schematically in the drawing by the arrow 23, of a first conductivity type. The vertical power FET 21 may be used as the high side switch or the low side switch in a half-bridge circuit, for example.

The lateral FET 22 is configured for driving the vertical power FET 21 and includes a channel region of a second conductivity type that opposes the first conductivity type. The channel is indicated schematically in FIG. 2 by the arrow 24. The vertical power FET 21 and the lateral FET 22 are monolithically integrated into a semiconductor substrate 20 which is of the first conductivity type. A drain 25 of the lateral FET 22 is electrically coupled to a gate 26 of the vertical power FET 21 so as to enable the lateral FET 22 to drive the vertical FET 21. The vertical power FET 21 may be used to provide the low side switch 12 of the high side switch 13 of the half-bridge circuit shown in FIG. 1 and the lateral FET 22 may be used to provide the transistor 17 of the output stage 19 of the driver circuit 10 shown in FIG. 1. The semiconductor device 20 can be used to provide a portion of the circuit of FIG. 1 as indicated in FIG. 1 by the box 20.

In some embodiments, the first conductivity type is n type and the second conductivity type is p type. In other embodiments, the first conductivity type is p type and the second conductivity type is n type.

The semiconductor substrate 20 is a semiconductor die of chip which may be formed of monocrystalline silicon or comprises an epitaxial layer of silicon grown on a monocrystalline silicon substrate.

The first lateral FET 22 and the vertical power FET 21 may be electrically isolated from one another by means of an isolation trench or isolation ring 27 that is filled with an insulating material, or by an implanted region.

The semiconductor substrate 21 includes a first surface 28 and a second surface 29 opposing the first surface 28. The lateral FET 22 is formed in a well 30 of the second conductivity type which extends into the semiconductor substrate 20 from the first surface 28. The well 30 has a base which is positioned within the semiconductor substrate 20 and spaced apart from the second surface 29. The lateral FET 22 comprises a plurality of first trenches 31 each having a base 32 and sidewalls 33. The trenches 31 may have an elongate stripe-like structure with the length of the trench 31 extending into the plane of the drawing. A gate insulating layer 34, e.g. a gate oxide, is arranged at on the base 32 of the trench 31 and a gate electrode 35 is arranged on the gate insulating layer 34. The gate electrode 35 is, therefore, arranged in the lower portion of the first trenches 31. The lateral FET 22 includes in addition to the drain contact 25, a gate contact 36 and source contact 37 arranged on the first surface 28 of the semiconductor substrate 20. The lateral FET 21 may provide the FET 17 of the gate driver circuit 10 shown in FIG. 1.

The vertical power FET 21 includes a source contact 38 on the first surface 28 which is laterally spaced apart from the gate contact 26 and a drain contact 39 which is arranged on the second surface 29. The vertical power FET also comprises a plurality of trenches 40 each including a base 41 and sidewalls 42. Each of the trenches 40 includes a field plate 43 arranged towards the bottom of the trench and a gate electrode 44 arranged towards the top of the trench. The gate electrode 44 of the vertical power FET 21 is arranged above and electrically insulated from the field plate 43. This arrangement of the gate electrode 44 in the upper portion of the trench 40 of the vertical power FET is in contrast to the lateral FET, which in which the gate electrode 35 is arranged in the lower portion of the trench 31.

In FIG. 1, only one transistor device 17 of the pair of transistor devices forming the output stage 19 is integrated into the semiconductor substrate 20 with the vertical power FET 13. However, in other embodiments, both transistor devices 17, 18 forming the output stage 19 is integrated into the semiconductor substrate 20 with the vertical power FET 13. The second transistor device 18 has a channel of the first conductivity type.

Figure 3:
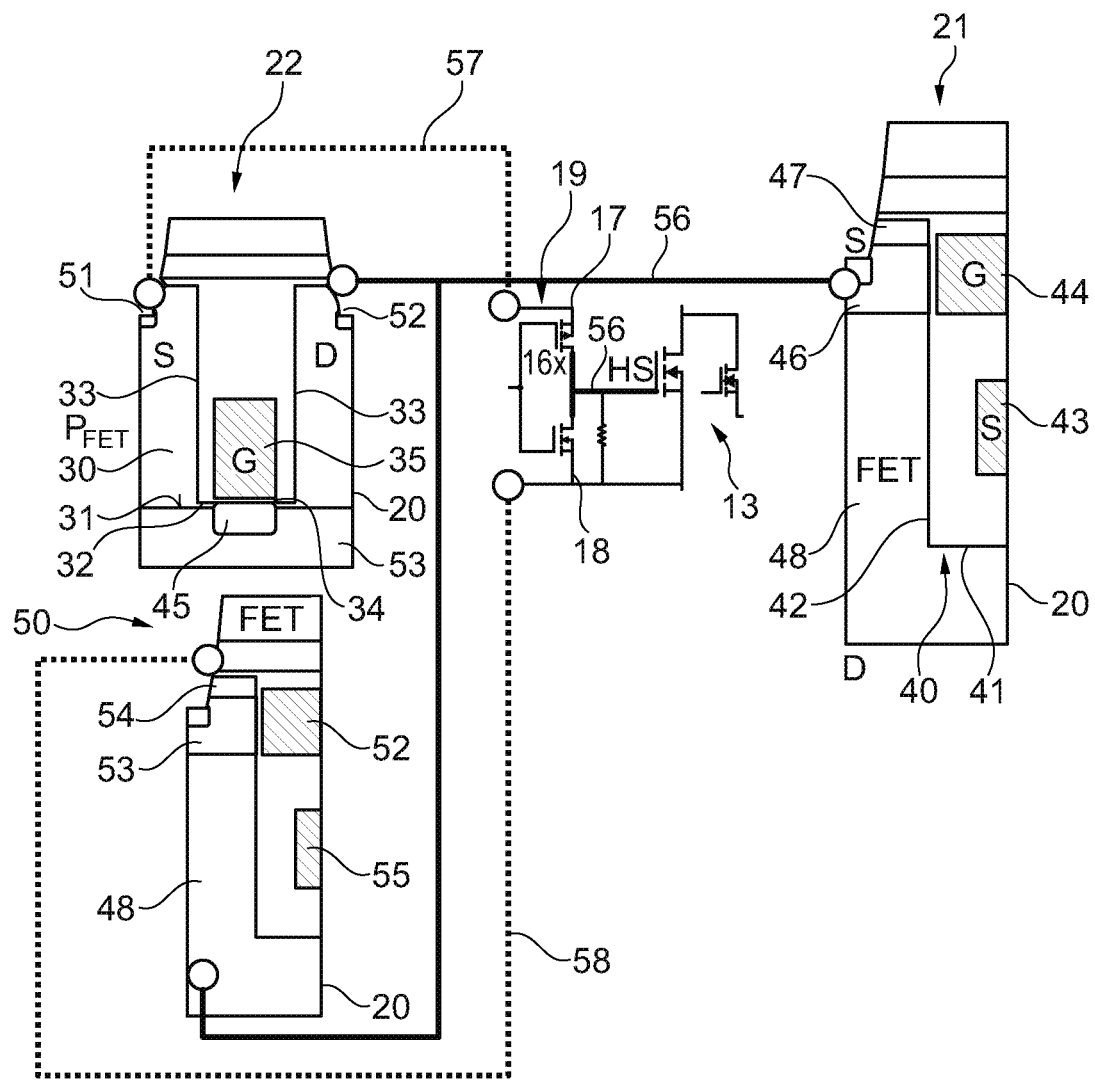
FIG. 3 illustrates a diagram illustrating the electrical connections between the lateral FET and the vertical power FET.
Figure 4:
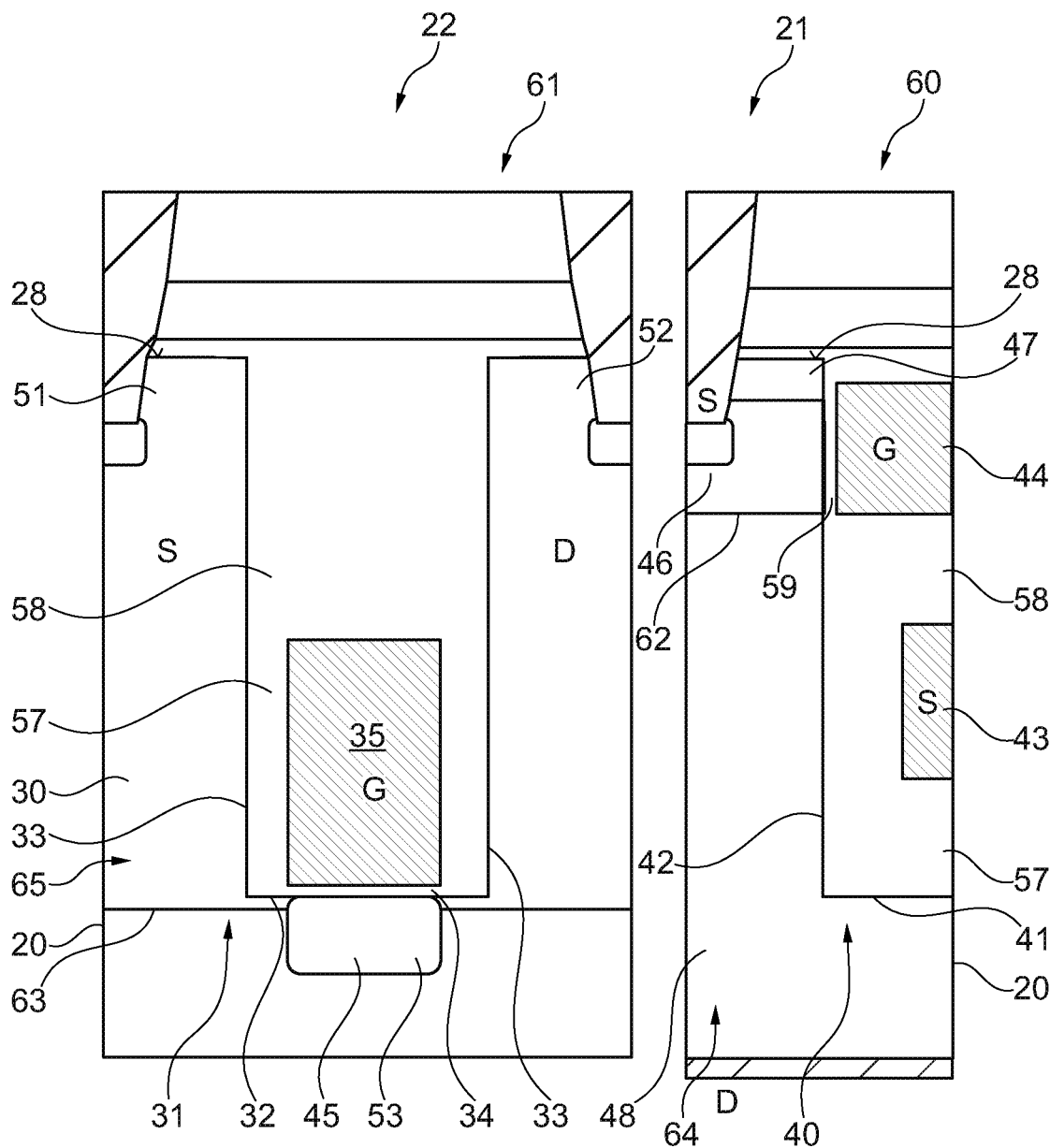
FIG. 4 illustrates an enlarged cross-sectional view of a transistor cell of the lateral FET and a transistor cell of the vertical power FET formed in the semiconductor substrate.

FIGS. 3 and 4 illustrate further cross-sectional views of the semiconductor substrate 20 in which the structure of the vertical power FET 21 and the lateral FET 22 is shown in more detail. In some embodiments, in addition a further FET 50 having a channel of the first conductivity type is also monolithically integrated into the semiconductor substrate 20. The lateral FET 22 may provide the transistor 17 and the further FET 50 the transistor 18 of the output stage 19 and the power FET 21 may provide the high side switch 13 of the circuit shown in FIG. 1. FIG. 3 also illustrates the electrical connections between the lateral FET 22, the further FET 50 and the vertical power FET 21 required to form the circuit.

In some embodiments, the first trenches 31 of the lateral FET may also include a dummy field plate which is positioned in the trenches 31 above the gate electrode 35 and electrically insulated from the gate electrode 35. The dummy field plate may be electrically floating.

The vertical power FET 21 includes a body region 46 which is of the second conductivity type and arranged on the drift region 48 and a source region 47 of the second conductivity type which is arranged on and/or in the body region 46 and which is positioned at the first surface 28 of the semiconductor substrate 20. The semiconductor substrate 20 is of the first conductivity type and forms the drift region 48 of the vertical power MOSFET and of the further FET 50. The source region 47 is typically more highly doped that the drift region 48.

The lateral FET 22 is formed in the well 30 of the second conductivity type and comprises a source region 51 and drain region 52 which are arranged on opposing sides of the trench 31 at the first surface 28. The base of 32 of the trench 31 is positioned in semiconductor material of the first conductivity type. This region forms the body region 53 of the lateral FET 22. The base 32 of the trench 31 may be positioned within the semiconductor substrate 20 or, as illustrated in FIGS. 3 and 4, in a further discrete region 45 of the first conductivity type that is formed at the base 32 of the trench 31. This discrete region 45 may be more highly doped that the semiconductor substrate 20.

The further FET 50 has a channel region of the first conductivity type and, therefore, of the opposing conductivity type to the lateral FET 22 and of the same conductivity type as the vertical power FET 21. The further FET 50 is formed in the semiconductor substrate 20 of the first conductivity type and comprises a plurality of trenches 51 each including a gate electrode 52 arranged towards the top of the trench, a body region 53 of the second conductivity type arranged on the drift region 48 and a source region 54 of the first conductivity type arranged on the body region 53. The further FET 50 also includes a field plate 55 arranged towards the bottom of the trench 51 that is electrically insulated from the gate electrode 52.

As is illustrated schematically in FIG. 3, the drain region 52 of the lateral FET 22 is electrically coupled to the gate electrode 44 of the vertical power FET 21. Similarly, the drain region of the further FET 50 is electrically coupled to the drain region 52 of the lateral FET 22 and to the gate electrode 44 of the vertical power 21 as indicated schematically in FIG. 3 by the line 56. The source region 51 of the lateral FET 22 as indicated schematically in FIG. 3 by the line 57 is electrically connected to the voltage line V of the gate driver circuit 10, as can be seen in FIG. 1. Referring to FIG. 1, the source region 54 of the further FET 50 is electrically connected to either phase node Phase or the ground node PGND, as is indicated schematically in FIG. 3 by the line 58, depending on whether the vertical power FET 21 provides the low side switch 12 or the high side switch 13 of the half bridge circuit.

FIG. 4 illustrates an enlarged view of one transistor cell 60 of the plurality of transistor cells of the vertical power FET 21 and one transistor cell 61 of the plurality of transistor cells of the lateral FET 22 that are monolithically integrated in the semiconductor substrate 20.

The transistor cell 60 of the vertical power FET 21 includes the trench 40 with its gate electrode 44 and field plate 43, and the mesa 64 formed between neighbouring ones of the trenches 40 in which the body region 46 and source region 47 are formed. The transistor cell 61 of the lateral FET 22 includes the trench 31 with its gate electrode 35, the body region 53 formed at the base of the trench 31 and the mesas 65 formed between neighbouring ones of the trenches 31. The source region 51 and drain region 52 are formed in mesas 65 arranged on opposing sides of the trench 31.

The gate electrodes 35, 44 and the field plate 43 as well as the dummy field plate if present are formed of electrically conductive material and may be formed of polysilicon. As can be more easily seen in the enlarged cross-sectional view of FIG. 4, the sidewalls 33 of the trenches 31 of the lateral FET 22 are lined with a first insulating layer 57 which has a greater thickness than the thickness of the gate insulating layer 34 arranged on the base 32 of the trench 31. A further intermediate insulation layer 58 is arranged on top of and covers the gate electrode 35 and extends to the surface 28 of the semiconductor substrate 20 filling the remainder of the trench 31. The insulation layer 58 electrically insulates the gate electrode 35 from the semiconductor substrate 20.

The trenches 40 of the vertical power FET 21 are also lined with the first electrically insulating layer 57 which is positioned on the sidewalls 42 and the base 41 such that the thickness of the first insulating layer 57 between the field plate 43 arranged in the lower portion of the trench 40 and the base 41 of the trench 40 is greater than the thickness of the gate insulating layer 34 arranged between the gate electrode 35 and the base 32 of the trenches 31 of the lateral FET 22. The gate electrode 44 arranged on the upper portion of the trench 40 is electrically insulated from the field plate 43 by the intervening electrically insulating layer 58. The thickness of the first insulating layer 57 between the sidewalls 42 and gate electrode 44 in the upper portion of the trench 40 is thinner than that on the sidewalls 42 in the lower part of the trench 40 in order to form the gate insulating layer 59 for the vertical power FET.

As can also be more easily seen in the enlarged view of FIG. 4, the pn junction 62 formed between the body region 46 and the drift region 48 of the vertical power FET 21 is positioned at a depth from the first surface 28 which is less than the depth from the front surface 28 of the pn junction 63 formed between the well 30, in which the lateral FET 22 is formed, and the underlying portion of the semiconductor substrate 20 which forms the body region 62 of the lateral FET 22.

In some embodiments, a dummy field plate is included in the portion of the trenches 31 of the lateral FET 22 that is electrically insulated from the underlying gate electrode 35, for example by the insulating layer 58. The use of the dummy field plate, which may be electrically floating and not connected to any further conductive material, may be used to reduce mechanical stress in the structure since the arrangement of the conductive material within the trenches 31 of the lateral trench 22 is more similar to the arrangement of the conductive material forming the field plate 43 and gate electrode 44 in the trenches 40 of the power of the vertical power FET 21.

Figure 5A:
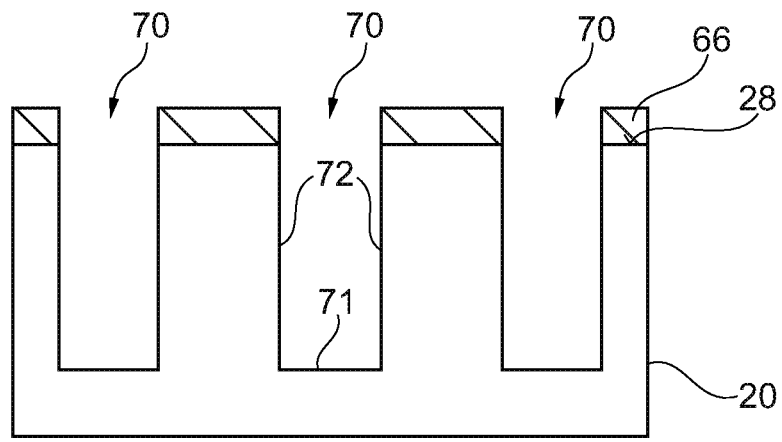
FIGS. 5A to 5O illustrate a method for fabricating a semiconductor device with a vertical power FET and lateral FET monolithically integrated into a semiconductor substrate.
Figure 5B:
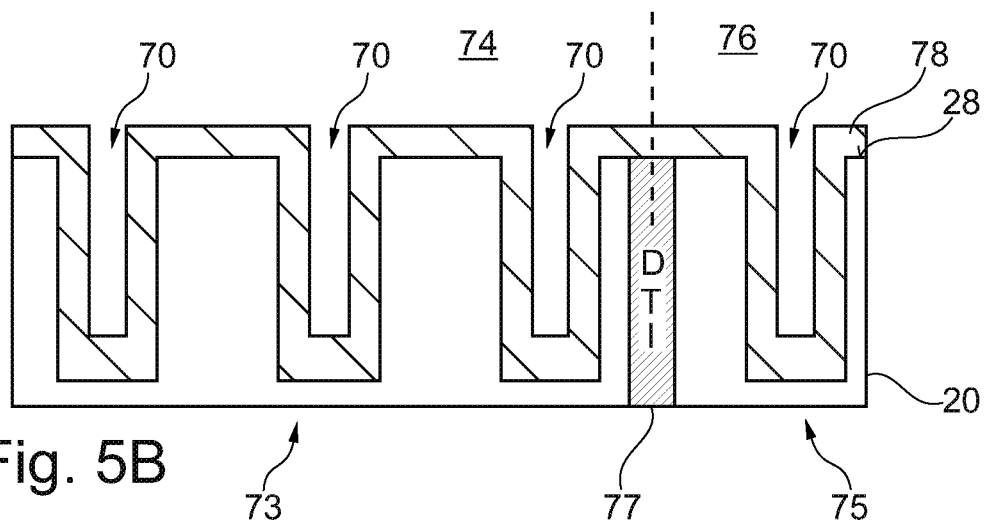
Figure 5C:
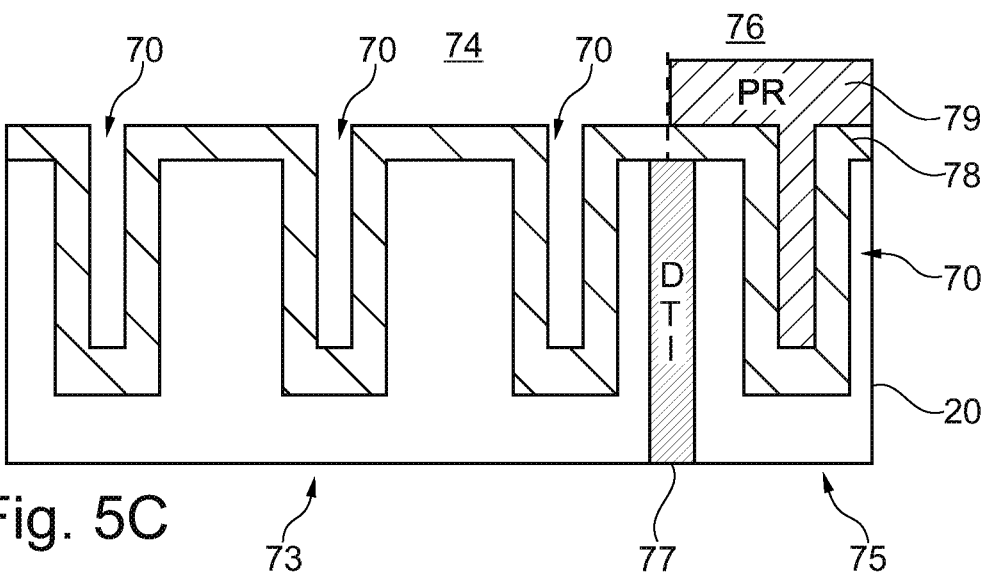
Figure 5D:
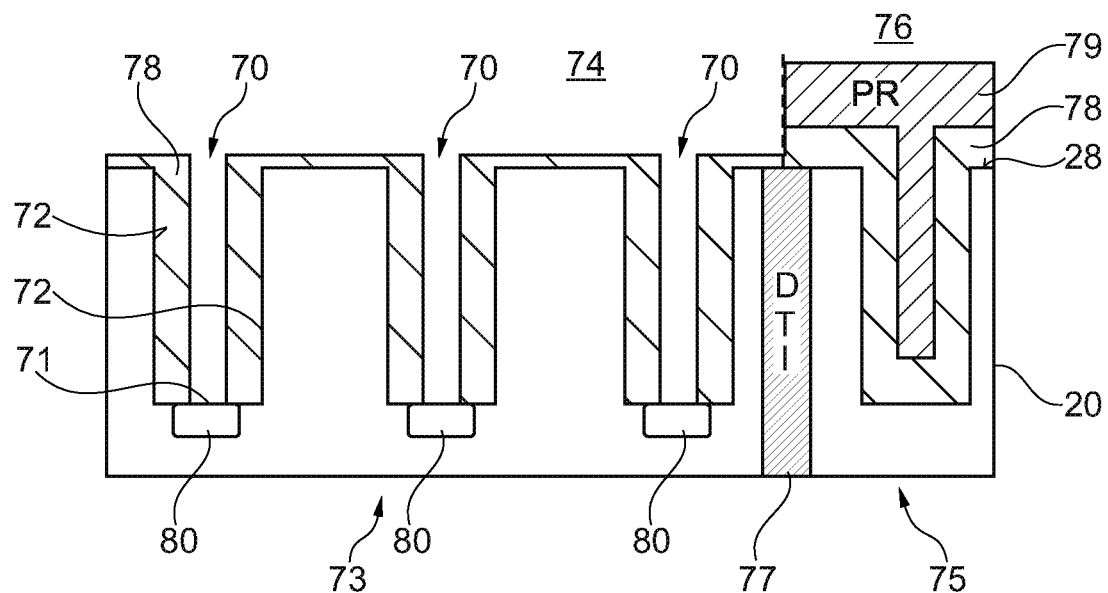
Figure 5E:
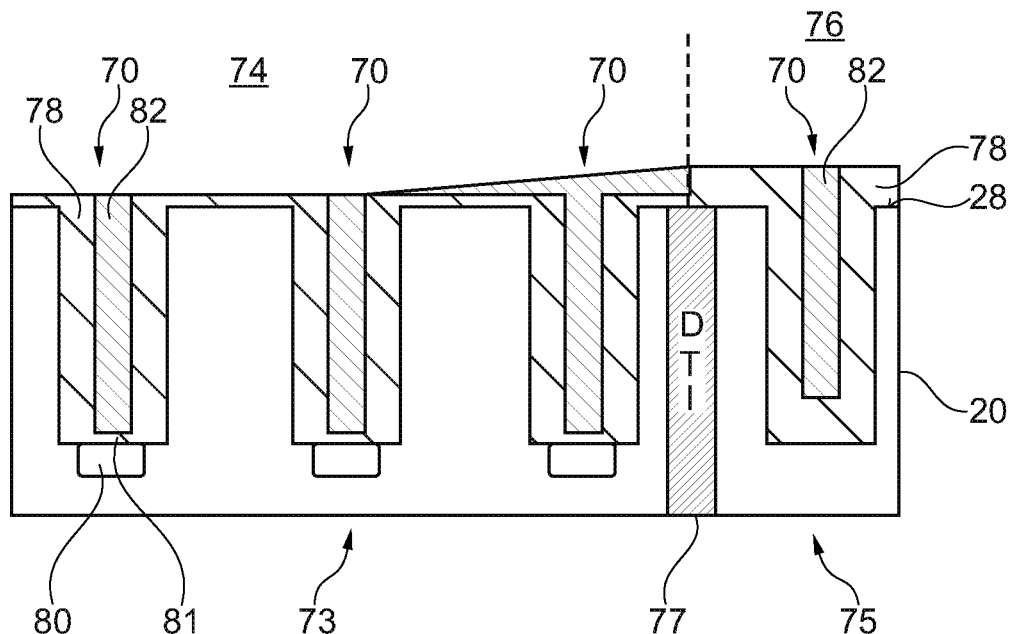
Figure 5N:
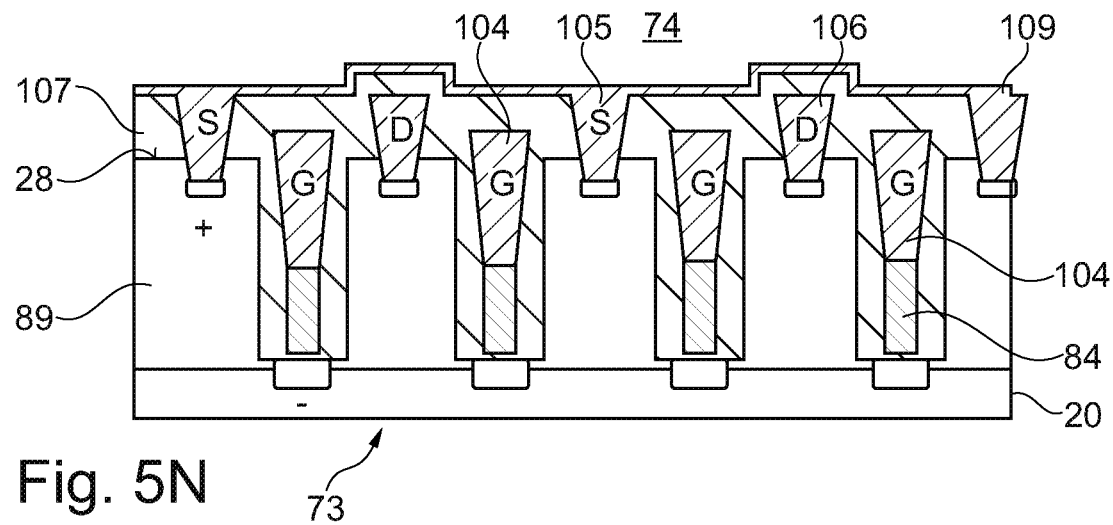
Figure 5O:
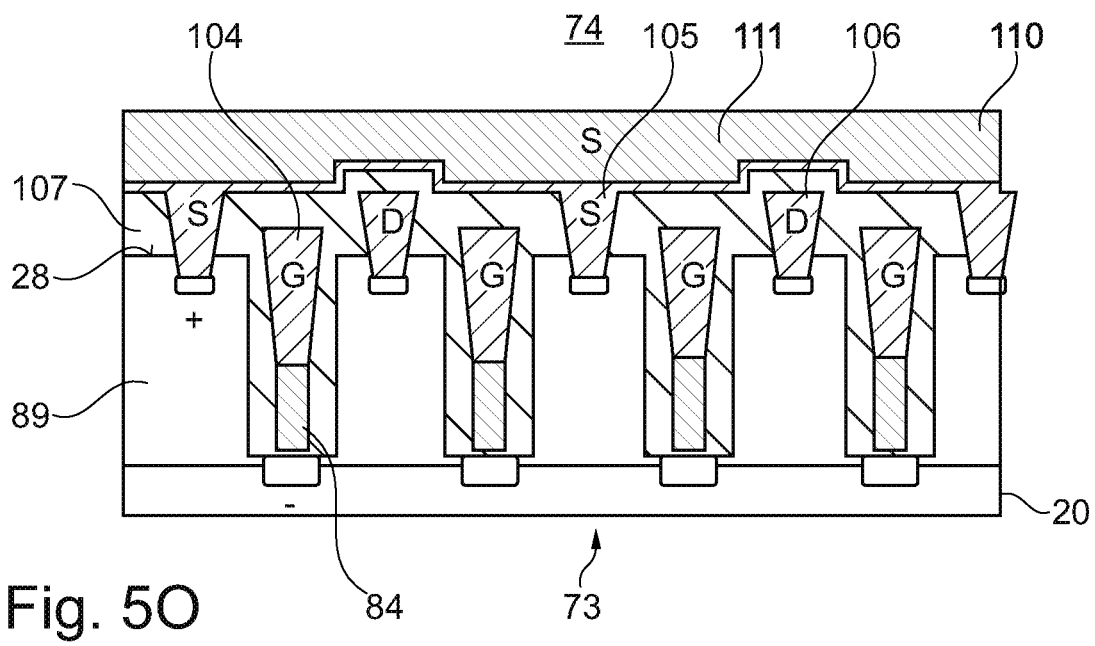

FIGS. 5A to 5O illustrate a method for fabricating a semiconductor device with a vertical power FET and lateral FET monolithically integrated into a semiconductor substrate 20. This method may be used for fabricating the semiconductor device 1000.

FIG. 5A illustrates the semiconductor substrate 20 and the first surface 28 which includes a plurality of trenches 70 which have been formed in the first surface 28 and which each have a base 71 and sidewalls 72. The semiconductor substrate 20 has the first conductivity type and may be a monocrystalline silicon substrate or an epitaxial silicon layer grown on a monocrystalline silicon substrate. The trenches 70 may have an elongate striped like structure with the long length extending into the plane of the drawing.

The semiconductor substrate 20 may be a semiconductor wafer including a plurality of component positions, each component position providing a semiconductor substrate or die of a semiconductor device in which a lateral FET and a vertical power FET are to be monolithically integrated, for example the semiconductor device with the lateral FET 21 and vertical power FET 22. In FIGS. 5A-5O, only a portion of one of these component positions is illustrated.

The trenches 70 may be formed in the first surface 28 of the semiconductor substrate 20 by applying a hard mask 66 onto the first surface 28, patterning the hard mask 66 to form openings 67 and etching the region of the first surface 28 exposed by the openings 67 to form the plurality of trenches 70. The hard mask 66 is then removed. The hard mask 66 may be formed of silicon nitride, for example.

Referring to FIG. 5B, the plurality of trenches 70 may be divided into two subsets. A first subset 73 of the trenches is arranged in a predefined area 74 of the semiconductor substrate in which a lateral FET 22 having a channel region of the second conductivity type will be formed. A second subset 75 of trenches are arranged in a switching area 76 of the semiconductor substrate 20 in which the vertical power MOSFET 21 having a channel region of the first conductivity type is to be formed. The predefined area 74 is arranged laterally adjacent the switching area 76 and may be electrically isolated from the switching area by an isolation region 77. The isolation region 77 may be a trench filled with an insulating material or an implanted region. Typically, the switching area 76 and the number of trenches in the second subset 75 is much larger than the area of the predefined area 74 and the number of trenches included in the first subset 73.

In embodiments in which a further FET, e.g. the lateral FET 50 having a channel region of the second conductivity type, the plurality of trenches 70 may be divided into three subsets, one for each transistor device.

Referring to FIG. 5B, a first electrically insulating layer 78 is formed which lines the sidewalls 72 and the base 71 of the plurality of trenches 70, leaving a gap at the centre of the trenches 70. The first electrically insulating layer 78 also extends over the first surface 28. This first insulating layer 78 extends throughout the predefined area 74 and the switching area 76 and over all of the plurality of trenches 70. The first electrically insulating layer 78 may be formed of silicon oxide which may be formed using a TEOS process and/or by thermal oxidation.

In some embodiments, the first electrically insulating layer 78 is formed by first using a thermal oxidation to form a first sublayer on the base 71 and side walls 72 of the trenches 70 and on the first surface 28 and then by depositing a second sublayer of silicon oxide layer using a TEOS process. The first electrically insulating layer 78 may then be densified. Optionally, the thickness may then be reduced.

Referring to FIG. 5C, a first mask 79 is applied which covers the switching area 76 and the second subset 75 of trenches and which leaves the predefined area 74 and the first subset 73 of trenches 70 uncovered by the first mask 79. The first mask 79 may be formed of photoresist, for example. In some embodiments, the first mask 79 also fills the gap in the trench 70 formed by the first electrically insulating layer 78 lining the sidewalls 72 and base 71 of the second subset 75 of trenches 70.

Referring to FIG. 5D, the first insulating layer 78 is removed from a portion of the base 71 of the first subset 73 of trenches such that the underlying region of the semiconductor substrate 20 is exposed. Dopants of the first conductivity type are then implanted through the base 71 of the first subset 73 of trenches to form a doped region 80 under the base 71 of the first subset 73 of trenches which may also form the at least a portion of the base 71 of the first subset 73 of trenches. The doped region 80 forms the body region of the lateral FET 22.

During the removal of the first electrically insulating layer 78 from the base 71 of the first subset of trenches 73, the thickness of the first electrically insulating layer 78 on the first surface 28 of the semiconductor substrate 20 may be reduced in the predefined area 74 such that after removal of the first mask 79, the thickness of the first electrically insulating layer 78 on the first surface 28 in the switching area 76 is greater than in the predefined area 74. In the first pre-defined area 74, the first surface 28 is, however, still covered by the remainder of the first electrically insulating layer 78.

Referring to FIG. 5E, a gate insulating layer 81, for example a gate oxide, is formed on the base 71 of the first subset 73 of trenches directly on the exposed region of the semiconductor substrate formed by the doped region 80. The gate oxide 81 may be formed by thermal oxidation of the exposed semiconductor material. The first mask 79 is then removed and conductive material 82 is inserted into all of the plurality of trenches 70. The conductive material 82 may be polysilicon. A planarization process, for example using chemical mechanical polishing may be carried out, whereby the remainder of the first electrically insulating layer 78 arranged on the first surface 28 acts as an etch stop.

Referring to FIG. 5F, the conductive material 82 is removed from the upper portion of the trenches 70 such that the remaining portion of the conductive material in the second subset 75 of trenches forms a field plate 83 for the vertical power FET 21 and the remaining portion in the first subset 73 of trenches forms the gate electrode 84 for the lateral FET. The thickness of the first insulating layer 78 on the base 71 of the second subset 75 of trenches is greater than the thickness of the gate insulating layer 81 arranged on the base 71 of the first subset 73 of trenches. The conductive material 82 may be removed using an etching process that is selective to the conductive material 82 over the material of the first insulating layer 78.

Referring to FIG. 5G, the first electrically insulating layer 78 is removed from the front surface 28 and from the upper portion of the sidewall 72 of all of the plurality of trenches 70 such that an uppermost region of the gate electrode 84 and of the field plate 83 protrudes above the remainder of the first electrically insulating layer 78 that is arranged on the sidewalls 72 in the lower portion of the trenches 70.

Referring to FIG. 5H, a second insulating layer 85 is formed in the plurality of trenches 70 which covers the gate electrodes 84 and field plate 83 and which covers the exposed sidewalls 72 in the upper portion of the trenches 70 and covers the first surface 28. The thickness of the second insulating layer 85 on the sidewalls 72 in the upper portion of the trenches 70 is less than the thickness of the second insulating layer 85 positioned on the gate electrode 84 and the field plate 83.

In some embodiments, the second insulating layer 85 may include two or more sublayers. A first sublayer is positioned on the gate electrodes 84 and field plate 83 and which extends between the sidewalls 72. A second sublayer is arranged on the first surface 28, on top of the first sublayer within the trenches 70 and on the exposed portions of the sidewalls 72 in the upper portion of the trenches 70 which remain uncovered by the first sublayer.

Still referring to FIG. 5H, conductive material 86 is formed in the upper portion of at least the second subset 75 of trenches which forms the gate electrode 87 of the vertical power FET 21. The gate electrode 87 is electrically insulated from the field plate 83 formed in the bottom of the trench by the intervening portion of the second insulating layer 85. The thin region of the second insulating layer 85 positioned on the sidewalls 72 in the upper portion of the trench 70 forms the gate insulating layer of the vertical power FET 21. In other embodiments, the conductive material 86 may also be inserted into the upper portion of the first subset 73 of trenches for the lateral FET 22. This conductive region may be used to form a dummy field plate which is electrically floating. The conductive material 86 may be polysilicon.

Referring to FIG. 5I, a second mask 88 is applied to the first surface 28 which covers the switching area 76 and which leaves the predefined area 74 uncovered. Dopants of the second conductivity type are implanted into the first surface 28 of the semiconductor substrate 20 so as to form a well 89 comprising the second conductivity type in the predefined area 74. The well 89 extends into the first surface 28 of the substrate 28 and has a base distinguished by a pn junction 90 which is formed between the well 89 and the underlying region of the semiconductor substrate 20 which includes dopants of the first conductivity type. The distance of the pn junction 90 from the first surface 28 is such that the base 71 of the first subset 73 of trenches is positioned within the well and such that the doped region 80 of the first conductivity type extends from the base 71 of the first subset of trenches 73 into the semiconductor substrate 20. The well 89 may have a graded doping profile with a doping level that is higher at the first surface 28 and decreases in the direction of the pn junction 90.

Referring to FIG. 5J, the second mask 88 is removed and a third mask 91 is applied to the predefined area 74 which leaves the switching area 76 uncovered. Dopants of a second conductivity type are inserted into the implanted into the switching area 76 to form a body region 92 and dopants of the first conductivity type are implanted into the switching area 76 to form a source region 93 positioned on the body region 92. The source region 93 may be more highly doped than the semiconductor substrate 20. A pn junction 94 is formed between the body region 92 and the underlying region of the semiconductor substrate 20 which forms the drift region of the vertical power MOSFET. The pn junction 94 formed between the body region 92 and the drift region is positioned at a smaller distance from the first major surface compared to the pn junction 90 between the base of the well 89 and the semiconductor substrate 20 in the predefined area 74. The third mask 91 is then removed.

Referring to FIG. 5K, one or more electrically insulating layers 95 of an interlayer dialectic are formed on the first surface 28 of the semiconductor substrate and openings for contacts are formed which extend through the insulating layer 95. In the switching area 76, an opening 96 is positioned above each of the second subset 75 of trenches so as to expose a region of the gate electrode 87 formed in the upper portion of the trench 70 and an opening 97 is formed into the first major surface 28 which extends through the source region 93 and body region 92. In the predefined area 74, an opening 98 is formed which extends to the gate electrode 84 formed in the lower portion of the first subset 73 of trenches and an opening 99, 100 is formed into the first surface 28 at a position on two opposing sides of individual ones of the trenches 70 of the first subset 73 of trenches in order to form the source and drain contacts of the lateral FET 22. In some embodiments, dopants of the second conductivity type may be implanted into the base of the openings 97, 99, 100 to form a contact region 115 at the base of the opening in the semiconductor substrate 20.

Referring to FIG. 5L, conductive material 101 is then inserted into the openings 96, 97, 99, 100 to form a contact 102 to the source region 93 in the switching area 76 and a contact 103 to the gate electrode 87 arranged towards the top of the first subset 75 of trenches in the switching area 76. In the predefined area 74, a contact 104 is formed in the opening 98 to the gate electrode 84 arranged in the lower portion of the second subset 73 of trenches and a source contact 105 and a drain contact 106 are formed in the openings 99, 100 for the lateral FET 22. The conductive material 101 may comprise tungsten and may have a multilayer structure. In some embodiments, a Ti/TiN or TiN/TiSi$_2$ barrier structure is first deposited followed by tungsten. A planarization process nay be carried out, for example by chemical mechanical polishing. In some embodiments, the conductive material 101 is selectively removed from the gate contacts 103, 104 for both the lateral FET 22 and vertical power FET 21 such that the upper surface of the gate contacts 103, 104 is substantially coplanar with the first surface 28 of the semiconductor substrate 20.

Referring to FIG. 5M, further interlayer dielectric layer(s) and electrically conductive layers may be formed on the first surface 28 to provide metallisation structure with a conductive redistribution structure on the first surface 28 of the semiconductor substrate 20.

One or more further interlayer dielectric (ILD) layers 107 is formed which covers the contacts 102, 103, 104, 105, 106. A fourth mask 109 is applied to the interlayer dielectric 107 which covers the drain contacts 106. An exposed portion of the interlayer dielectric 107 is removed to expose the source contacts 105 of the lateral FET 22.

Referring to FIGS. 5N and 5O, one or more conductive layers 109, 110 are deposited so as to form a source bus 111 on the front surface that electrically connects the exposed source contacts 105 of the lateral FET 22 to one another and to the source bus 111.

The metallization structure is patterned to provide electrical connections from the source regions of the lateral FET to a source bus, the drain regions of the lateral FET 21 to a drain bus and the drain bus of the lateral FET 21 to the gate electrodes of the power FET 22 and the gate electrodes of the lateral FET 21 to a gate bus.

The gate electrodes of the vertical power FET are electrically connected to a gate bus that is coupled to the drain bus of the lateral FET. The source regions of the vertical power FET are coupled to a source pad. The drain of the vertical power FET is not shown in the enlarged cross-sectional views of FIGS. 5A-5O but is formed on the rear surface of the semiconductor substrate which opposes the first surface 28.

Figure 6A:
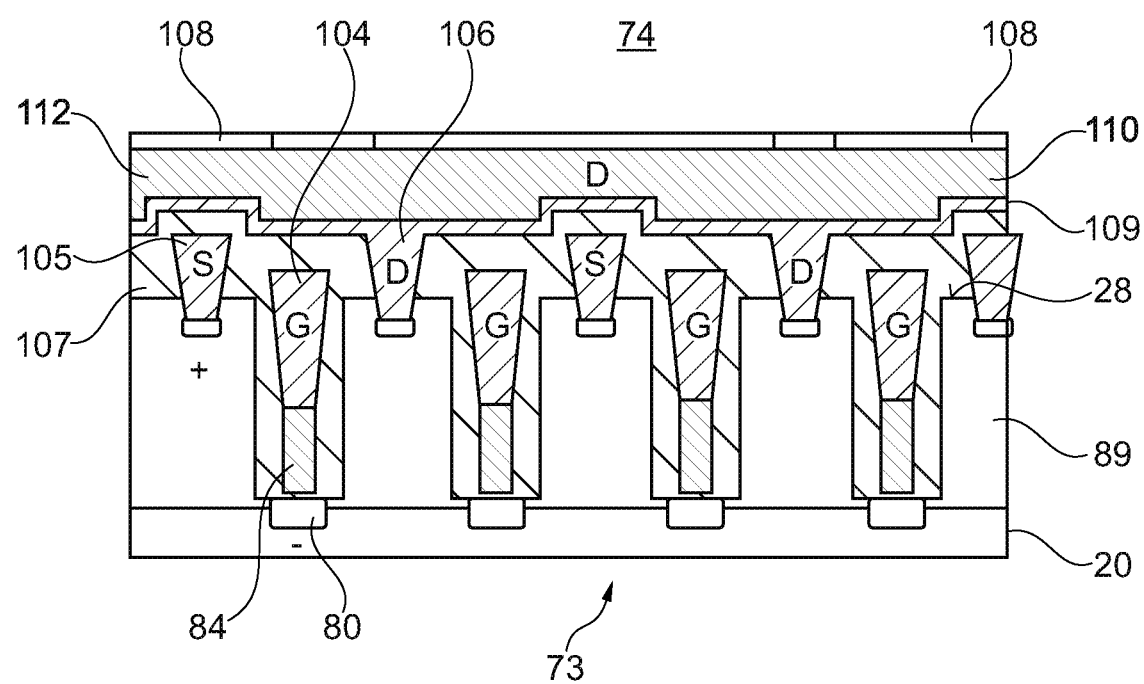
FIGS. 6A to 6G illustrate cross-sectional views of portions of the lateral FET of the semiconductor device.
Figure 6B:
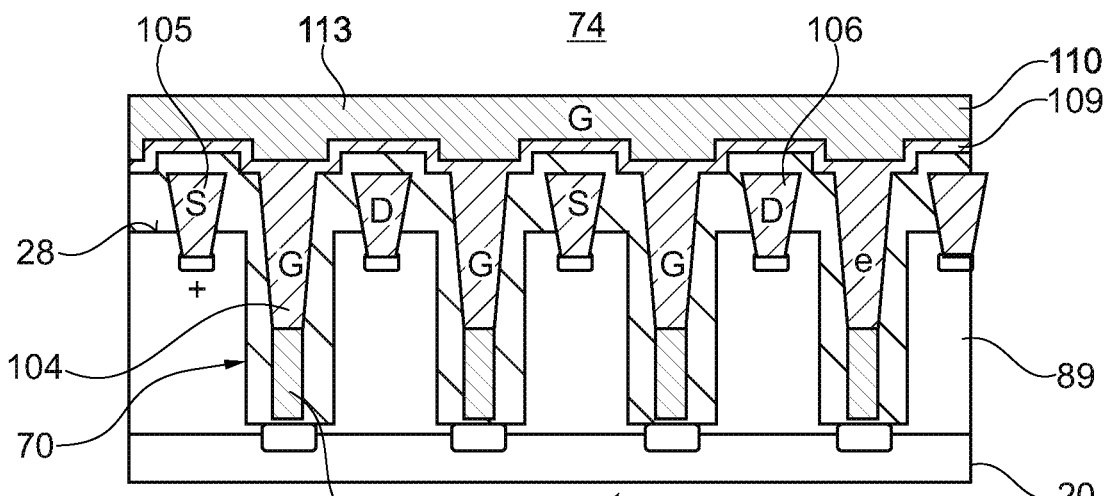
Figure 6C:
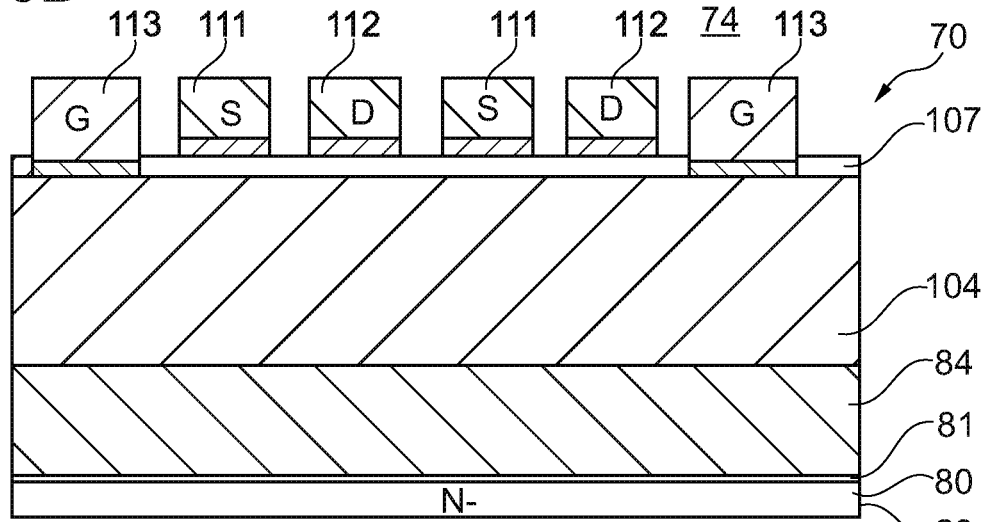
Figure 6D:
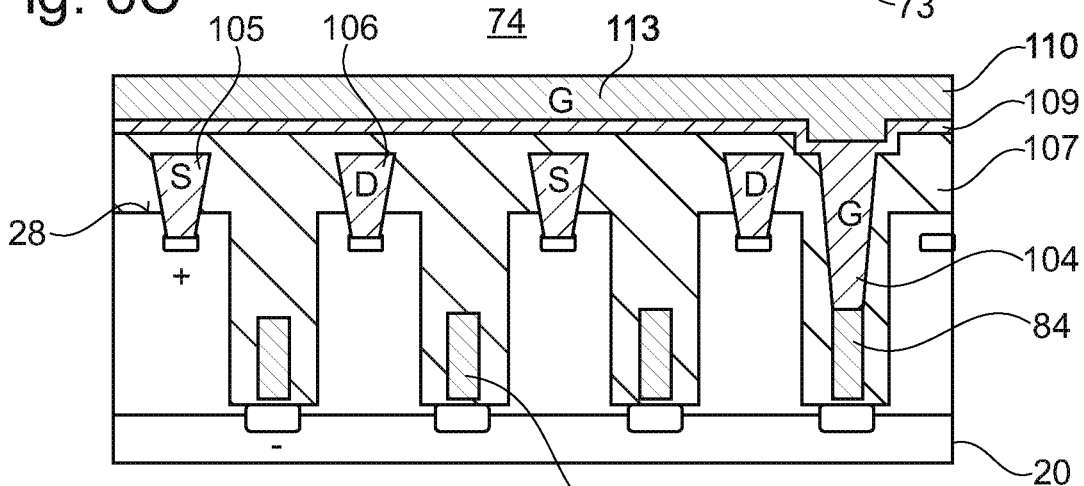
Figure 6E:
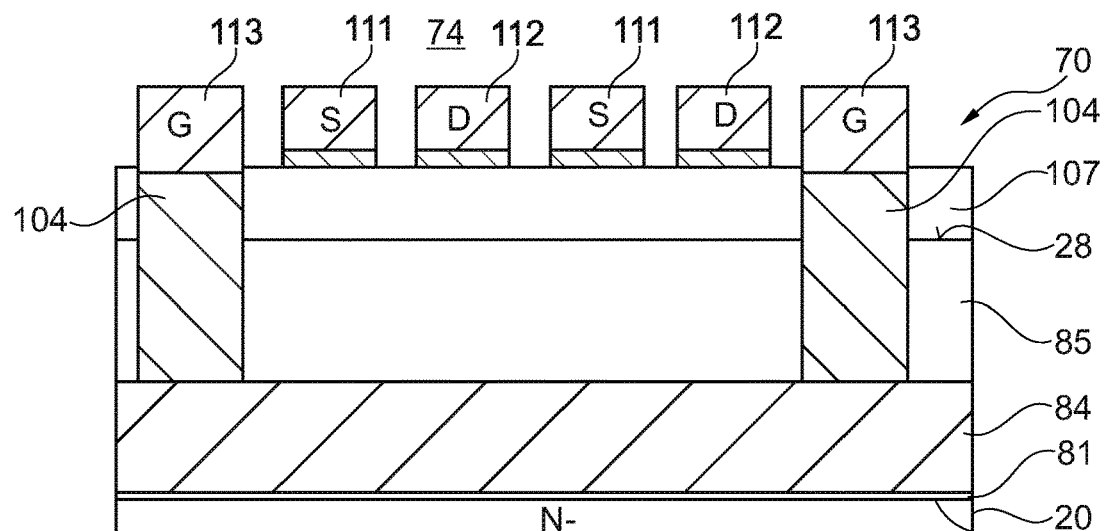
Figure 6F:
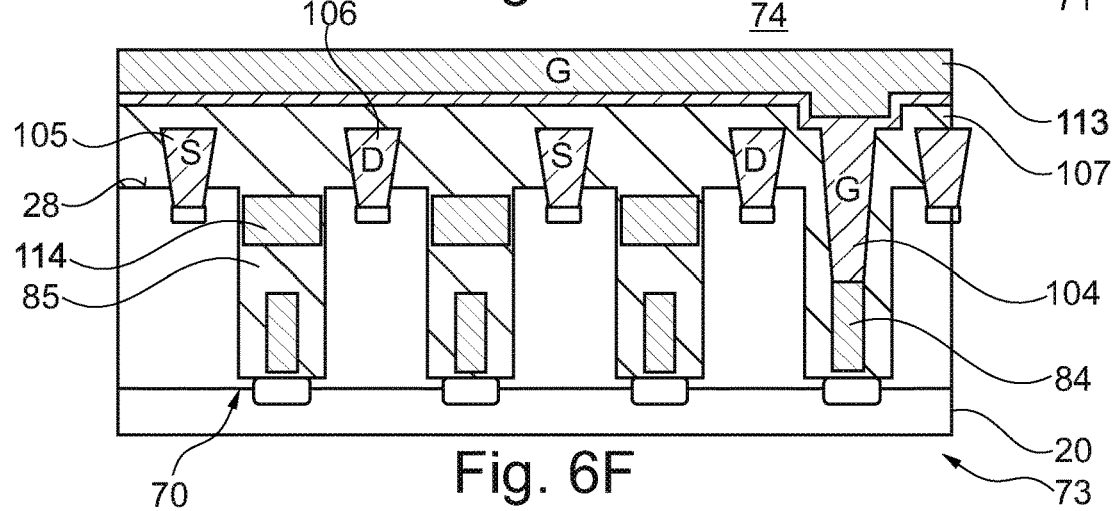
Figure 6G:
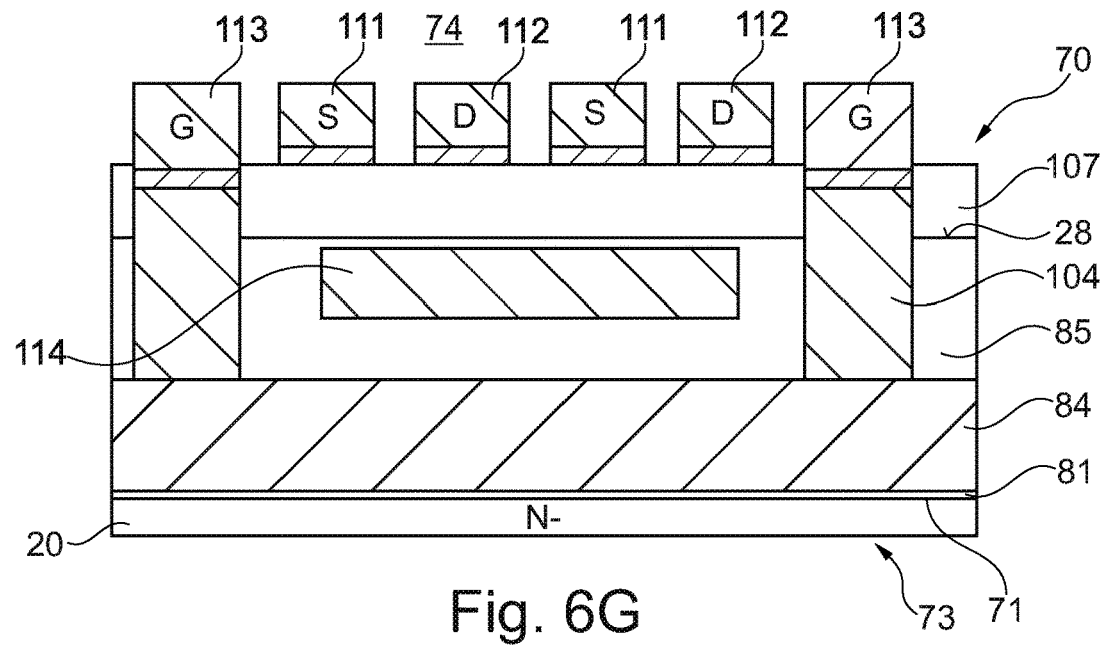

FIGS. 6A to 6G illustrate further cross-sectional views of the lateral FET 22 illustrated in FIG. 5O. FIG. 6A illustrates a cross-sectional view of showing the contacts to the drain bus and FIG. 7B illustrates a cross-sectional view of showing the contacts to the gate bus. FIG. 6C illustrates a cross-section view along one of the trenches 70 of the first subset 73 of trenches. FIGS. 6D and 6E illustrate two cross-sectional views of the connections to the gate bus according to another embodiment. FIGS. 6F and 6G illustrate two cross-sectional views of the connections to the gate bus according to another embodiment.

FIG. 6A illustrates a cross-sectional view of a further portion of the semiconductor substrate 20 and, in particular, of the predefined area 74 and the lateral FET 22. As can be seen in the cross-sectional view of FIG. 6A, in some areas, the source contacts 105 remain covered by the interlayer dielectric layer 107. In these regions, the fourth mask 108 covers the source contacts 105, openings are formed through the interlayer dielectric layer 107 and the drain contacts 106 exposed. The conductive layers 109, 110 are applied and patterned to form a drain bus 112 on the first surface which is electrically connected to the drain contacts 106 of the lateral FET 22. The drain bus 112 is electrically insulated from the underlying source contacts 105 and gate contacts 104 by the intervening portion of the interlayer dielectric layer 107.

FIG. 6B illustrates a further cross-sectional view of the predefined area 74 and illustrates that in yet another area of the semiconductor substrate 20, the source contacts 105 and drain contacts 106 are covered by the interlayer dielectric layer 107 and the gate contacts 104 are exposed by removing the portion of the interlayer dielectric layer 107 arranged above the gate contacts 104. The conductive layers 109, 110 form a gate bus 113 on the first surface 28 of the semiconductor substrate 20 that is electrically connects the gate contacts 104 to one another and the gate bus 113.

FIG. 6C illustrates a cross-sectional view along the length of a trench 70 of the first subset 73 of trenches of the lateral FET 22. FIG. 6C shows that the gate electrode 84, the gate insulating layer 81 and implanted region 80 at the base 71 of the trench 70 extend along the length of the trench 70. The length of the gate electrode 84 is covered by the conductive material 101 which, in this embodiment, is tungsten. This conductive material 101 protrudes through the interlayer dielectric 107 at two positions to form two gate contacts 104, each of which is in contact with a gate bus 113. The source and drain buses 111, 112 extend perpendicularly to the length of the trench 70 and are electrically insulated from the conductive material 101 within the trench 70 by the interlayer dielectric layer 107.

FIG. 6D illustrates a cross-sectional view of the lateral FET 22 in which a plurality of the first subset 73 of trenches 70 can be seen. FIG. 6D illustrates that the gate contact 104 to the gate electrode 84 positioned in the lower portion of the trench 70 is positioned in only a portion of the length of the trench 70. The remaining regions of the length of the trench 70 are filled with electrically insulating material 107 which covers the gate electrode 84.

FIG. 6E illustrates a cross-sectional view along the length of the trench 70 shown in FIG. 6D. FIG. 6E illustrates that two gate contacts 104 may be located spaced apart along the length of the trench 70. The source and drain buses 111, 112 are positioned on the interlayer dielectric layer 107 that fills the upper portion of the trench 70.

FIG. 6F illustrates a cross-sectional view of a plurality of the first subset 73 of trenches 70 of the lateral FET 22 according to another embodiment. In this embodiment, the first subset 73 of trenches include a dummy field plate 114 positioned in the upper portion of the trench 70. This dummy field plate 114 is covered by the interlayer dielectric layer 107. The dummy field plate 114 does not extend along the entire length of the trench 70 such that the gate contact 104 can be positioned in a region of the trench 79 that is unoccupied by the dummy field plate 114. The gate contact 104 extends between the gate bus 113 and the gate electrode 84 in the lower portion of the trench 70 through the interlayer dielectric 107 that fills the upper portion of the trench 70.

FIG. 6G illustrates a cross-sectional view along the length of trench 70 of FIG. 6F. FIG. 6G illustrates that the dummy field plate 114 is positioned in the upper portion of the trench 70 and is electrically isolated from the underlying gate electrode 84 by the second electrically insulating layer 85. Two gate contacts 104 are provided which are spaced apart from one another and in electrical contact with the gate electrode 84. The gate contacts 104 are electrically isolated from the floating field plate 114 by intervening portions of the second electrically insulating layer 85 and interlayer dielectric layer 107. The source and drain buses 111, 112 are electrically insulated from the underlying dummy field plate 114 by the interlayer dielectric layer 107.

FIGS. 7A to 7C illustrate a method according to an embodiment for removing the first insulating layer 78 from the base 71 of the first subset 73 of trenches in the predefined area 74 and for forming the structure illustrated in FIG. 5D.

In this embodiment, a two stage etch process is used. As is illustrated in FIG. 7A, the first subset 73 of trenches 70 are lined with the first electrically insulating layer 78. A first etch process is carried out which preferentially removes the first electrically insulating layer 78 from the horizontal surfaces, i.e. from the base 71 of the trench 70 and from the first surface 28 of the semiconductor substrate 20 as shown by the dashed line. This first etching process may be a dry etch, for example a plasma etch.

Referring to FIG. 7B, whilst the remaining thickness of the first electrically insulating layer 78 covers the base 71 of the trench, the dopants of the first conductivity type are implanted into the semiconductor substrate 20 through the base 71 of the trench 70 to form the region 80 doped with the first conductivity type.

A second etching process is then carried out to entirely remove the remainder of the first electrically insulating layer 78 from the base 71 of the trench 70, as shown in FIG. 7C. This second etching process may be a wet etching process that also reduces the thickness of the first insulating layer 78 arranged on vertical surfaces, i.e. the side walls 72 of the trench 70. This may be used to reduce the thickness of the first electrically insulating layer 78 on the sidewalls 72 of the trench 70 to the desired final thickness as shown by the dashed line in FIG. 7C.

The methods described with reference to FIGS. 5A-5O enables the lateral FET 22 to be fabricated using many of the same process steps that are used for fabricating the vertical power FET 21, in particular by placing the gate electrode 84 at the base of a subset 73 of the plurality of trenches 70, the same etching process to form the trenches 70 and the same insulating process to line the trenches 70 with the first insulating layer 78 and the same deposition process for the conductive material for the gate electrode 84 and the field plate 83 can be used as for the trenches of the vertical power FET 21. Thus, the lateral FET 21 can be more simply monolithically integrated into the semiconductor substrate 20 used for the vertical power MOSFET 21.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a vertical power FET configured to switch a load current and provide a channel of a first conductivity type; and
a lateral FET configured to drive the vertical power FET and provide a channel of a second conductivity type opposing the first conductivity type;
wherein the vertical power FET and the lateral FET are monolithically integrated into a semiconductor substrate of the first conductivity type,
wherein a drain of the lateral FET is electrically coupled to a gate of the vertical power FET.

2. The semiconductor device of claim 1, wherein the semiconductor substrate comprises a first surface and a well of the second conductivity type extending into the semiconductor substrate from the first surface, wherein the lateral FET is formed in the well and comprises a plurality of trenches, each comprising a base and side walls, wherein a gate insulating layer is arranged at the base of the trenches and a gate electrode is arranged on the gate insulating layer.

3. The semiconductor device of claim 2, wherein a source region and a drain region of the lateral FET are arranged at the first surface, and wherein the base of the trenches is arranged in the semiconductor substrate.

4. The semiconductor device of claim 2, further comprising an electrically conductive dummy field plate that is arranged in the trenches above and electrically insulated from the gate electrode.

5. The semiconductor device of claim 2, wherein the vertical power FET comprises a plurality of trenches extending into the semiconductor substrate from the first surface, wherein each trench of the vertical power FET comprises a field plate arranged at a bottom of the trench and a gate electrode arranged above and electrically insulated from the field plate.

6. The semiconductor device of claim 5, wherein each trench of the vertical power FET is lined with an insulating layer that has a thickness on the base of the trench that is greater than a thickness of the gate insulating layer arranged on the base of the trenches of the lateral FET.

7. The semiconductor device of claim 5, wherein the plurality of trenches of the lateral FET and the plurality of trenches of the vertical power FET have substantially the same depth and substantially the same width.

8. The semiconductor device of claim 2, wherein the semiconductor substrate comprises a vertical drift region of the vertical power FET and a body region of the lateral FET, wherein the vertical power FET further comprises a body region arranged on the drift region, a source region at the first surface that is arranged on the body region, and a drain region arranged at a second surface of the semiconductor substrate that opposes the first surface, wherein the well forms a pn junction with the semiconductor substrate that is arranged at a greater depth from the first surface than a pn junction formed between the body region and the drift region of the vertical power FET.

9. The semiconductor device of claim 1, further comprising a further FET configured to drive the vertical power FET and provide a channel of the first conductivity type, wherein the further FET is monolithically integrated into the semiconductor substrate and has a drain coupled to the gate of the vertical power FET, and wherein the lateral FET and the further FET provide an output stage of a gate driver circuit.

10. A method for fabricating a semiconductor device having a vertical power FET for switching a load current and a lateral FET for driving the vertical power FET, the method comprising:
- forming a plurality of trenches in a first surface of a semiconductor substrate having a first conductivity type, each trench having a base and side walls;
- forming a first insulating layer that lines the base and the side walls of the trenches;
- in a first subset of the plurality of trenches that are located in a pre-defined area of the semiconductor substrate for forming a lateral FET comprising a channel region of a second conductivity type opposing the first conductivity type, removing the first insulating layer from the base of the first subset of trenches and forming a gate insulating layer on the base of the first subset of trenches;
- inserting conductive material into the plurality of trenches;
- removing the conductive material from an upper portion of the plurality of trenches and forming a gate electrode in the first subset of trenches and a field plate in a second subset of the plurality of trenches for forming the vertical power FET comprising a channel region of the first conductivity type, wherein the second subset of trenches is arranged outside of the pre-defined area and in a switching area of the semiconductor substrate.

11. The method of claim 10, further comprising:
- forming a second insulating layer in the plurality of trenches that lines the side walls in the upper portion of the plurality of trenches that forms a gate insulating layer in the second subset of trenches;
- forming conductive material in at least the second subset of trenches and forming a gate electrode above and electrically insulated from the field plate;
- implanting dopants of the second conductivity type into the semiconductor substrate in the pre-defined area and forming a well having the second conductivity type;
- implanting dopants of the second conductivity type into the switching area to form a body region of the vertical power FET and implanting dopants of the first conductivity type into the switching area to form a source region on the body region;
- forming a third insulating layer on the first surface of the semiconductor substrate;
- in the switching area, forming an opening in the third insulating layer for a contact to each of the gate electrodes in the second subset of trenches and for a contact to each of the source regions;
- in the pre-defined area, forming an opening in the third insulating layer for a contact to the gate electrode in the first subset of trenches and to the well in the semiconductor substrate on opposing sides of individual ones of the first subset of trenches to form a source and drain contact for the lateral FET, respectively; and
- inserting conductive material into the openings.

12. The method of claim 10, wherein removing the first insulating layer from the base of the first subset of trenches and forming a gate insulating layer on the base of the first subset of trenches comprises:
- covering the second subset of trenches in the switching area with a first mask; dry etching and reducing the thickness of the first insulating layer at the base of the first subset of trenches;
- wet etching the first insulating layer and removing the first insulating layer entirely from a portion of the base of the first subset of trenches and reducing the thickness of the first insulating layer on the side walls of the first subset of trenches; forming the gate insulating layer at the base of the first subset of trenches; and
- removing the first mask.

13. The method of claim 12, further comprising:
- implanting dopants of the first conductivity type into the semiconductor substrate under the base of the first subset of trenches; and
- afterwards, forming the gate insulating layer on the base of the first subset of trenches.

14. The method of claim 11, further comprising:
- covering the switching area with a second mask and then implanting the dopants of the second conductivity type into the semiconductor substrate in the pre-defined area to form the well;
- removing the second mask; and
- covering the pre-defined area with a third mask and then implanting the dopants of the second conductivity type into the switching area to form the body region and implanting dopants of the first conductivity type into the switching area to form the source region on the body region.

15. The method of claim 11, further comprising:
forming a metallization structure on the first surface of the semiconductor substrate and electrically coupling the drain of the lateral FET and to a gate of the vertical power FET.

* * * * *